(12) United States Patent
Taniguchi et al.

(10) Patent No.: US 11,324,114 B2
(45) Date of Patent: May 3, 2022

(54) CYLINDRICAL PRINTED BOARD AND PRINTED-BOARD-INTEGRATED MOLDED ARTICLE

(71) Applicant: NISSHA CO., LTD., Kyoto (JP)

(72) Inventors: Chuzo Taniguchi, Kyoto (JP); Yasuhide Fukada, Kyoto (JP); Eiji Kawashima, Kyoto (JP); Yasuisa Takinishi, Kyoto (JP); Takeshi Nishimura, Kyoto (JP); Tomohiro Yamaoka, Kyoto (JP); Yuki Naito, Kyoto (JP); Yuu Kuwataka, Kyoto (JP); Koji Asai, Kyoto (JP); Takenori Yoshida, Kyoto (JP)

(73) Assignee: NISSHA CO., LTD., Kyoto (JP)

( * ) Notice: Subject to any disclaimer, the term of this patent is extended or adjusted under 35 U.S.C. 154(b) by 0 days.

(21) Appl. No.: 17/513,857

(22) Filed: Oct. 28, 2021

(65) Prior Publication Data
US 2022/0053635 A1 Feb. 17, 2022

Related U.S. Application Data

(63) Continuation of application No. PCT/JP2020/015194, filed on Apr. 2, 2020.

(30) Foreign Application Priority Data

May 24, 2019 (JP) .............................. JP2019-097913
Oct. 28, 2019 (JP) .............................. JP2019-195187

(51) Int. Cl.
*H05K 1/02* (2006.01)
*H05K 5/00* (2006.01)
(Continued)

(52) U.S. Cl.
CPC ......... *H05K 1/0284* (2013.01); *H05K 5/0039* (2013.01)

(58) Field of Classification Search
CPC .... H05K 1/0277; H05K 1/028; H05K 1/0284; H05K 1/189; H05K 1/0393; H05K 1/02;
(Continued)

(56) References Cited

U.S. PATENT DOCUMENTS 4,376,927 A * 3/1983 McGalliard .......... H01H 85/046
337/284
4,399,488 A * 8/1983 Ruwe ....................... H05K 1/14
361/749
(Continued)

FOREIGN PATENT DOCUMENTS

JP S61262316 11/1986
JP H0183387 6/1989
(Continued)

OTHER PUBLICATIONS

"Office Action of Japan Counterpart Application", dated Mar. 2, 2021, with English translation thereof, pp. 1-16.
(Continued)

*Primary Examiner* — Hoa C Nguyen
*Assistant Examiner* — Amol H Patel
(74) *Attorney, Agent, or Firm* — JCIPRNET

(57) ABSTRACT

To provide a cylindrical printed board in which a processing shape is maintained, and a printed-board-integrated molded article in which the cylindrical printed board is integrated with an inner wall of a hole portion in a molded article. A cylindrical printed board 1 according to the present invention is a printed board 4 including an insulator substrate 2 and a conductor pattern 3 formed on the insulator substrate 2, wherein the printed board 4 is rolled beyond one full circle to form a cylindrical shape. In addition, a printed-board-
(Continued)

integrated molded article 40 includes a molded article 20 constituting a casing that has a cylindrical part, and the cylindrical printed board 4 that is integrated with an inner wall 21a of a hole portion 21 in the cylindrical part of the molded article 20.

20 Claims, 27 Drawing Sheets

(51) Int. Cl.
  *H05K 1/03* (2006.01)
  *H05K 5/02* (2006.01)
  *H05K 7/14* (2006.01)
(58) Field of Classification Search
  CPC .......... H05K 1/03; H05K 3/326; H05K 5/003; H05K 5/0034; H05K 5/0039; H05K 5/02; H05K 2201/051; H05K 2201/057; H05K 7/14
  See application file for complete search history.

(56) References Cited

U.S. PATENT DOCUMENTS

| | | | | |
|---|---|---|---|---|
| 4,412,272 | A * | 10/1983 | Wedertz | H05K 3/284 361/749 |
| 4,675,625 | A * | 6/1987 | Johnston | H05K 1/0248 333/161 |
| 4,728,834 | A * | 3/1988 | Kumar | H02K 24/00 310/43 |
| 4,783,359 | A * | 11/1988 | Fleischer | H01P 9/00 428/209 |
| 4,810,917 | A * | 3/1989 | Kumar | H02K 11/33 29/841 |
| 5,747,743 | A * | 5/1998 | Kato | H05K 1/028 174/254 |
| 6,118,072 | A * | 9/2000 | Scott | H05K 1/189 174/254 |
| 8,628,493 | B2 * | 1/2014 | Ahn | A61M 37/0015 604/890.1 |
| 9,462,685 | B2 * | 10/2016 | Lin | H05K 1/028 |
| 2008/0118681 | A1 * | 5/2008 | Ueno | B32B 37/0046 156/367 |
| 2009/0050785 | A1 * | 2/2009 | Flaherty | H05K 1/189 250/206 |
| 2009/0079531 | A1 * | 3/2009 | Zach | H01F 5/003 336/200 |
| 2013/0056248 | A1 * | 3/2013 | Kajiya | H05K 1/028 174/254 |
| 2014/0313684 | A1 * | 10/2014 | Hughes | H05K 1/0284 361/783 |
| 2019/0229428 | A1 * | 7/2019 | Beskov | H05K 1/0243 |
| 2020/0260582 | A1 * | 8/2020 | Rasmussen | H05K 3/326 |
| 2020/0411974 | A1 * | 12/2020 | Jiang | H05K 1/165 |

FOREIGN PATENT DOCUMENTS

| | | |
|---|---|---|
| JP | H10284809 | 10/1998 |
| JP | H10335759 | 12/1998 |
| JP | 2004111563 | 4/2004 |
| JP | 2006524003 | 10/2006 |
| JP | 2011228077 | 11/2011 |
| WO | 2016174983 | 11/2016 |
| WO | 2017110832 | 6/2017 |

OTHER PUBLICATIONS

"International Search Report (Form PCT/ISA/210) of PCT/JP2020/015194," dated Jul. 7, 2020, with English translation thereof, pp. 1-6.

* cited by examiner (a)　　　　　　　(b)

(a)

(b)

rolling direction rolling direction

CYLINDRICAL PRINTED BOARD AND PRINTED-BOARD-INTEGRATED MOLDED ARTICLE

CROSS-REFERENCE TO RELATED APPLICATIONS

This application is a continuation application of International Application number PCT/JP2020/015194, filed on Apr. 2, 2020, which claims the priority benefit of Japan Patent Application No. 2019-097913, filed on May 24, 2019 and Japan Patent Application No. 2019-195187, filed on Oct. 28, 2020. The entirety of each of the above-mentioned patent applications is hereby incorporated by reference herein and made a part of this specification.

BACKGROUND

Technical Field

The present invention relates to a cylindrical printed board and a printed-board-integrated molded article in which the cylindrical printed board is integrated with an inner wall of a hole portion in a molded article.

Related Art

With the miniaturization, multi-functionality, and low cost of electronic devices, it is required to compactly store a printed board in a casing. The printed board is a general term for a printed wiring board (PWB) and a printed circuit board (PCB). Specific functional examples of the printed board include a touch sensor, a pressure sensor, an antenna for internet of things (IoT), a heater, a cable harness, and the like. In addition, a flexible printed circuit (FPC) using flexible materials is also a type of printed board.

An electronic device in which this printed board is compactly stored in a casing may be, for example, a wearable device, and the like.

For example, the wearable device is a bifocal eyeglass 100 equipped with a lens focus switching function that enables instant switching between near and far with one touch. Normally, the bifocal eyeglass 100 serves as a far-middle lens that covers a wide range from a distant place to an intermediate distance, but when a user touches a casing including a touch sensor 130 of a temple (vine) 103, a voltage is applied to a liquid crystal part incorporated in a lower center of a lens 110 so that a refractive index changes and the bifocal eyeglass enters a presbyopia mode (see FIG. 16). Then, when the touch sensor 130 is touched again, the bifocal eyeglass 100 returns to an original state (see Patent literature 1).

In addition, another example of the wearable device may be an earphone 200 having a remote controller 204 for remotely controlling an apparatus such as a personal audio apparatus or the like.

This earphone 200 generally has a set of two earpieces 201 that can be inserted into ears of the user, and the remote controller 204 that controls one or more functions of the apparatus (see FIG. 17). By inserting a plug 203 into a socket of the apparatus (not shown), both the remote controller 204 and the earpiece 201 are connected to the apparatus. The remote controller 204 is normally included in a wire 202 somewhere between the earpiece 201 and the plug 203, and performs control by the user touching a casing including a touch sensor 234, for example to adjust the volume, skip to the previous/next song, fast forward/rewind the song, and the like.

In addition, because the remote controller 204 hanging as a part of the wire 202 does not have a fixed position and must be searched for when to be used, there is also an earphone 200 in which a touch sensor 214 is included in a casing of a cylindrical part of the earpiece 201 (see Patent literature 2).

In these examples, in order to compactly store the printed board in the casing, a printed board which is processed into a three-dimensional shape in accordance with a shape of the casing is required. That is, for the cylindrical part of the temple (vine) 103 of the bifocal eyeglass 100, and the cylindrical part of the remote controller 204 or the earpiece 201 of the earphone 200, the printed board is processed into a cylindrical shape.

FIG. 18 is a perspective view showing a cylindrical printed board 11 in this case.

The cylindrical printed board 11 shown in FIG. 18 is a printed board 14 including an insulator substrate 12 and a conductor pattern 13 such as a wiring, a circuit, or the like formed on the insulator substrate 12, and the printed board 14 is bent to form a cylindrical shape in a manner that one side 121 and an opposite side 122 of the insulator substrate 12 abut against each other.

In this way, wirings and circuits can be formed by utilizing an entire inner wall 21a of a hole portion 21 for storing the cylindrical printed board 11 in a molded article 20 constituting the casing having the cylindrical part (see FIG. 19). As a result, the miniaturization is maintained and a forming area of the wiring and the circuit is expanded as compared with a flat printed board.

For example, if the printed board 11 that functions as a touch sensor as described above is a cylindrical body, an input 30 can be performed from all directions toward a center of the cylindrical body. In addition, by expanding the forming area of the wiring and the circuit of the printed board 11, the printed board 11 can also have a plurality of functions including functions other than the touch sensor.

LITERATURE OF RELATED ART

Patent Literature

Patent literature 1: Republished 2017-110832
Patent literature 2: National Publication of International Patent Application No. 2006-524003

SUMMARY

Problems to be Solved

However, in the cylindrical printed board 11 shown in FIG. 17, a phenomenon called springback in which a force acts to restore the insulator substrate 12 bent into a cylindrical shape to an original shape by rigidity of the insulator substrate 12 occurs. As a result, there is a problem that the abutted parts 121 and 122 of the insulator substrate 12 are opened (see (a) of FIG. 20), and a processing shape of the cylindrical printed board cannot be maintained.

In addition, even if the abutted parts 121 and 122 of the insulator substrate 12 are fixed, the cylindrical shape can be maintained, but because the abutted parts 121 and 122 are in contact with each other by a line, deformations occur with the linear parts as a fulcrum. That is, because the insulator substrate 12 is distorted to extend in a radial direction passing through a center of the cylinder from the abutted parts 121 and 122 (see (b) of FIG. 20), the processing shape also cannot be maintained.

Furthermore, when a diameter of the cylinder is small, this springback makes it difficult to form the printed board 14 into a cylindrical shape.

Besides, because the processing shape of the cylindrical printed board 11 cannot be maintained, an outer shape of the cylindrical printed board 11 does not match an opening shape of the hole portion 21 of the molded article 20, and it becomes difficult to insert and install the cylindrical printed board 11 in the hole portion 21 of the molded article 20.

In addition, even if the cylindrical printed board 11 can be inserted and installed in the hole portion 21 of the molded article 20, the processing shape of the cylindrical printed board 11 cannot be maintained, and thus the cylindrical printed board 11 may not function accurately. For example, when the cylindrical printed board 11 functions as a touch sensor, a gap is partially formed between the cylindrical printed board 11 and an inner wall of the hole portion 21 of the molded article 20, and a sensitivity is partially lowered.

Thus, an objective of the present invention is to provide a cylindrical printed board of which a processing shape is maintained, and a printed-board-integrated molded article in which the cylindrical printed board is integrated with an inner wall of a hole portion in a molded article.

Means to Solve Problems

Hereinafter, a plurality of aspects are described as means for solving the problems. These aspects can be arbitrarily combined as needed.

A cylindrical printed board according to the present invention is a printed board including an insulator substrate and a conductor pattern formed on the insulator substrate, and the printed board is overlapped and rolled to form a cylindrical shape.

According to this configuration, because the printed board is overlapped and rolled to form a cylindrical shape, even if a force acts to restore the insulator substrate rolled in a cylindrical shape to an original shape by rigidity of the insulator substrate, a return of rolling processing is suppressed by friction in an overlapping region of the printed board. In addition, because the overlapping regions of the printed board are in contact with each other by a surface, the overlapping regions do not serve as a fulcrum for distortion such as butt. Thus, the cylindrical printed board can maintain a processing shape.

Moreover, the above effect is improved as the overlapping region of the printed board expands in a rolling direction.

The printed board may have a rectangular shape, and may be rolled beyond one full circle in a direction parallel to one side of the printed board and overlapped in an entire direction orthogonal to the above direction to form a cylindrical shape.

In addition, the printed board may be rolled one and a half full circles or more to form a cylindrical shape. Furthermore, the printed board may be rolled two full circles or more to form a cylindrical shape.

According to these configurations, because the printed board is rolled beyond one full circle to form a cylindrical shape, even if a force acts to restore the insulator substrate rolled in a cylindrical shape to an original shape by rigidity of the insulator substrate, the return of the rolling processing is suppressed by friction in an overlapping region of the printed board. In addition, because the overlapping regions of the printed board are in contact with each other by a surface, the overlapping regions do not serve as a fulcrum for distortion such as butt. Thus, the cylindrical printed board can maintain a processing shape.

Moreover, the above effect is improved as the overlapping region of the printed board expands in a rolling direction.

Hereinafter, preferred aspects of the cylindrical printed board according to the present invention are described.

As one aspect, the cylindrical printed board suitably includes a conductor pattern forming region, and a conductor pattern non-forming region which is adjacent to the conductor pattern forming region in a rolling direction and in which the cylindrical printed board is rolled one full circle or more.

Moreover, the conductor pattern non-forming region can be arranged adjacent to a center side of the conductor pattern forming region in the rolling direction. In addition, the conductor pattern non-forming region can also be arranged adjacent to an outer side of the conductor pattern forming region in the rolling direction. Furthermore, the conductor pattern non-forming region can also be arranged respectively adjacent to the center side and the outer side of the conductor pattern forming region in the rolling direction.

According to these configurations, a strength of the cylindrical printed board is increased, and the cylindrical printed board is not easily crushed even when an external force is applied.

In addition, when the conductor pattern non-forming region is arranged adjacent to the outer side of the conductor pattern forming region in the rolling direction, the conductor pattern non-forming region also functions as a protective layer.

As one aspect, the cylindrical printed board suitably includes a first functional region in which a conductor pattern having a first function is formed, and a second functional region which is adjacent to the first functional region in the rolling direction and in which a conductor pattern having a second function is formed, and the first functional region overlaps with the second functional region.

According to this configuration, because conductor patterns having different functions exist in an overlapping manner, a space can be effectively utilized, and a plurality of functions can be obtained without increasing a size of the printed board.

As one aspect, it is suitable that at least an outer end portion of an overlapping region of the printed board is fixed.

According to this configuration, even if a force acts to restore the insulator substrate rolled in a cylindrical shape to an original shape by rigidity of the insulator substrate, the return of the rolling processing is further reliably suppressed by fixing in the overlapping region of the printed board.

A cylindrical printed board according to the present invention is a printed board including an insulator substrate and a conductor pattern formed on the insulator substrate, wherein the printed board is spirally rolled to form a cylindrical shape, the printed board does not have an overlapping region, and an abutting portion of the printed board is fixed.

According to this configuration, because the printed board is spirally rolled and the abutting portion is fixed, the return of the rolling processing is suppressed. In addition, the cylindrical shape is less likely to be distorted as compared with a case where the printed board is simply rolled one full circle to fix the abutting portion. Thus, the cylindrical shape can be maintained. Moreover, because the shape can be maintained, an electrical characteristic is stable.

As one aspect, it is suitable that the printed board is spirally rolled to form a cylindrical shape, the printed board has the overlapping region, and an outermost end portion of rolling of the printed board is fixed.

According to this configuration, the printed board generates a frictional force in the overlapping region, and the outermost end portion of rolling is fixed, so that the return of the rolling processing is suppressed. In addition, the cylindrical shape is less likely to be distorted as compared with the case where the printed board is simply rolled one full circle to fix the abutting portion. Thus, the cylindrical shape can be maintained. Moreover, because the shape can be maintained, the electrical characteristic is stable.

As one aspect, the conductor pattern suitably has a connection wiring that extends in parallel to an axial direction of the cylindrical printed board and reaches at least one end portion of the printed board, and has at least one notch directed along the connection wiring from the one end portion to the other end portion.

In addition, as one aspect, the conductor pattern of the printed board which is spirally rolled to form a cylindrical shape suitably has a connection wiring that extends in parallel to an axial direction of the cylindrical printed board and reaches at least one end portion of the printed board, and has at least two notches directed along the connection wiring from the one end portion to the other end portion.

According to these configurations, because the cylindrical printed board has the notch along the connection wiring, it is possible to bend a region in which the connection wiring is formed to at least one side of the inner side and the outer side of the cylindrical printed board. Thus, the degree of freedom in external connection of the connection wiring is increased.

Moreover, the cylindrical printed board may have the connection wiring at least on an innermost side of rolling, and a region having the connection wiring may be bent toward the inner side the printed board.

In each of the above aspects, the cylindrical shape can be a columnar shape. Moreover, in the present specification, the columnar shape means that a diameter of the printed board rolled into a cylindrical shape is the same at both ends of the cylinder.

In addition, in each of the above aspects, the cylindrical shape can be a truncated conical shape. In the present specification, the truncated conical shape means that the diameter of the printed board rolled into a cylindrical shape is different at both ends of the cylinder.

A printed-board-integrated molded article according to the present invention includes a molded article constituting a casing that has a cylindrical part, and the cylindrical printed board that is integrated with an inner wall of a hole portion in the cylindrical part of the molded article and has no notch in each of the above aspects. The casing may include only the cylindrical part.

In addition, a printed-board-integrated molded article may include a molded article constituting a casing that has a cylindrical part, and the cylindrical printed board that is integrated with an inner wall of a hole portion in the cylindrical part of the molded article and has a notch in each of the above aspects.

According to these configurations, as described above, because the processing shape of the cylindrical printed board is maintained, it is easy to insert and install the cylindrical printed board in the hole portion of the molded article. In addition, because the processing shape of the cylindrical printed board is maintained, an unnecessary gap is not partially formed between the cylindrical printed board and the inner wall of the hole portion of the molded article, and the cylindrical printed board functions accurately.

Moreover, the cylindrical printed board having no notch can be integrated in a manner that an outermost region of rolling is bonded onto the molded article. The cylindrical printed board having a notch can be integrated in a manner that an outermost region of rolling is bonded onto the molded article, and a region in which the connection wiring is formed may be not bonded to the molded article.

In addition, the cylindrical printed board having no notch can be integrated in a manner that at least an outermost region of rolling is embedded in the molded article. The entire cylindrical printed board may be embedded in the molded article. The cylindrical printed board having a notch can be integrated in a manner that at least an outermost region of rolling is embedded in a surface of the molded article, and a region in which the connection wiring is formed may be not adhered to the molded article.

In addition, an outer peripheral surface of the cylindrical printed board can be exposed from the molded article on at least one end of the cylindrical printed board.

According to this configuration, because a connection end portion of the wiring arranged on the outer peripheral surface of the cylindrical printed board can be exposed from the molded article, external connection is easy.

In addition, an outer peripheral surface of the cylindrical printed board can be exposed from the molded article on at least one end of the cylindrical printed board, the exposed outer peripheral surface can have a region in which the connection wiring is formed and at least one notch formed beyond an end portion of the molded article along the region, and a region of the unexposed outer peripheral surface in which the notch is formed may be not adhered to the molded article.

According to this configuration, because the notch is formed beyond the end portion of the molded article and the region of the unexposed outer peripheral surface in which the notch is formed is not adhered to the molded article, the printed board in the region in which the connection wiring is formed can be further bent by a length of a non-adhesive part. Thus, the degree of freedom in external connection of the connection wiring is further increased.

Figure 21:
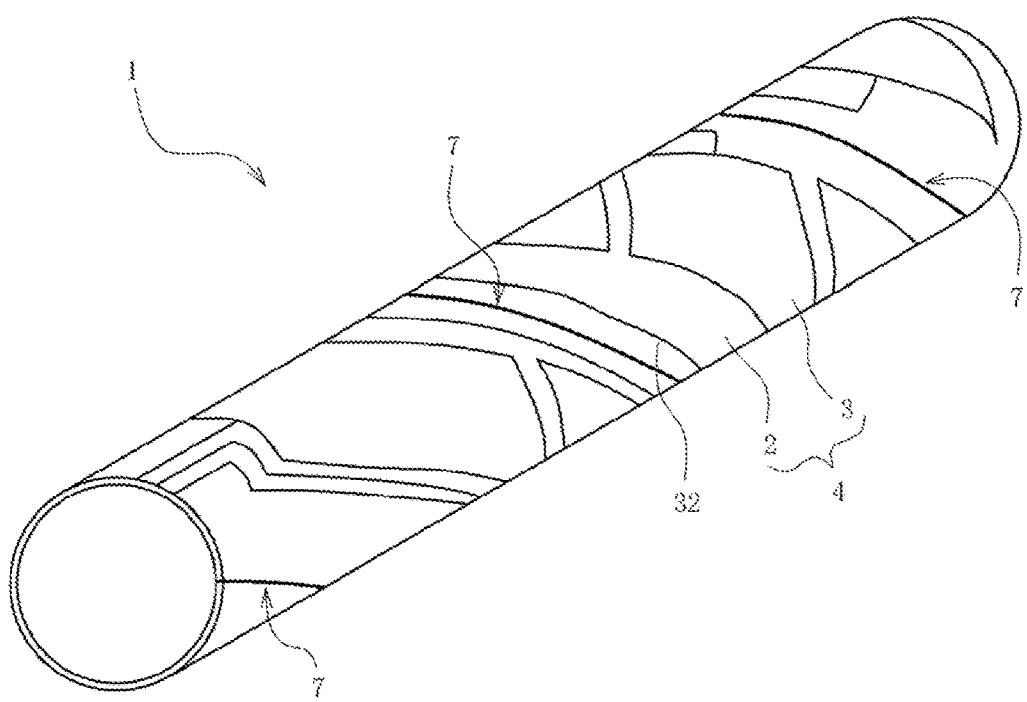
Figure 21:
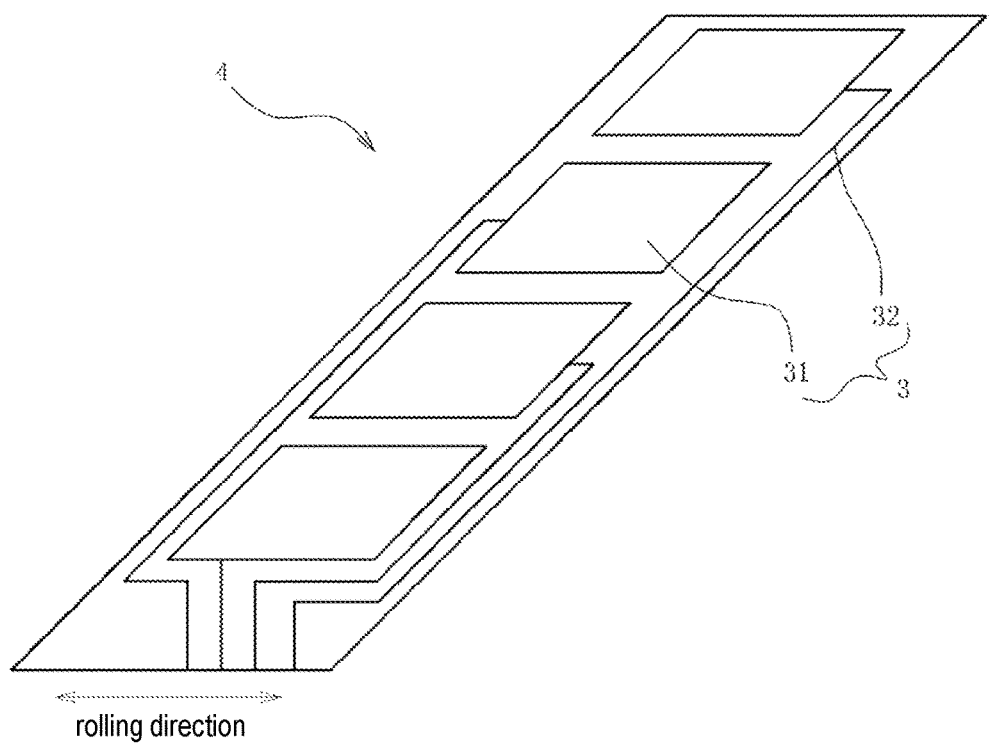

(a) of FIG. 21 is a perspective view showing another embodiment of the cylindrical printed board according to the present invention, and (b) of FIG. 21 is a plan view showing a printed board obtained by developing another embodiment of the cylindrical printed board according to the present invention.

Figure 22:
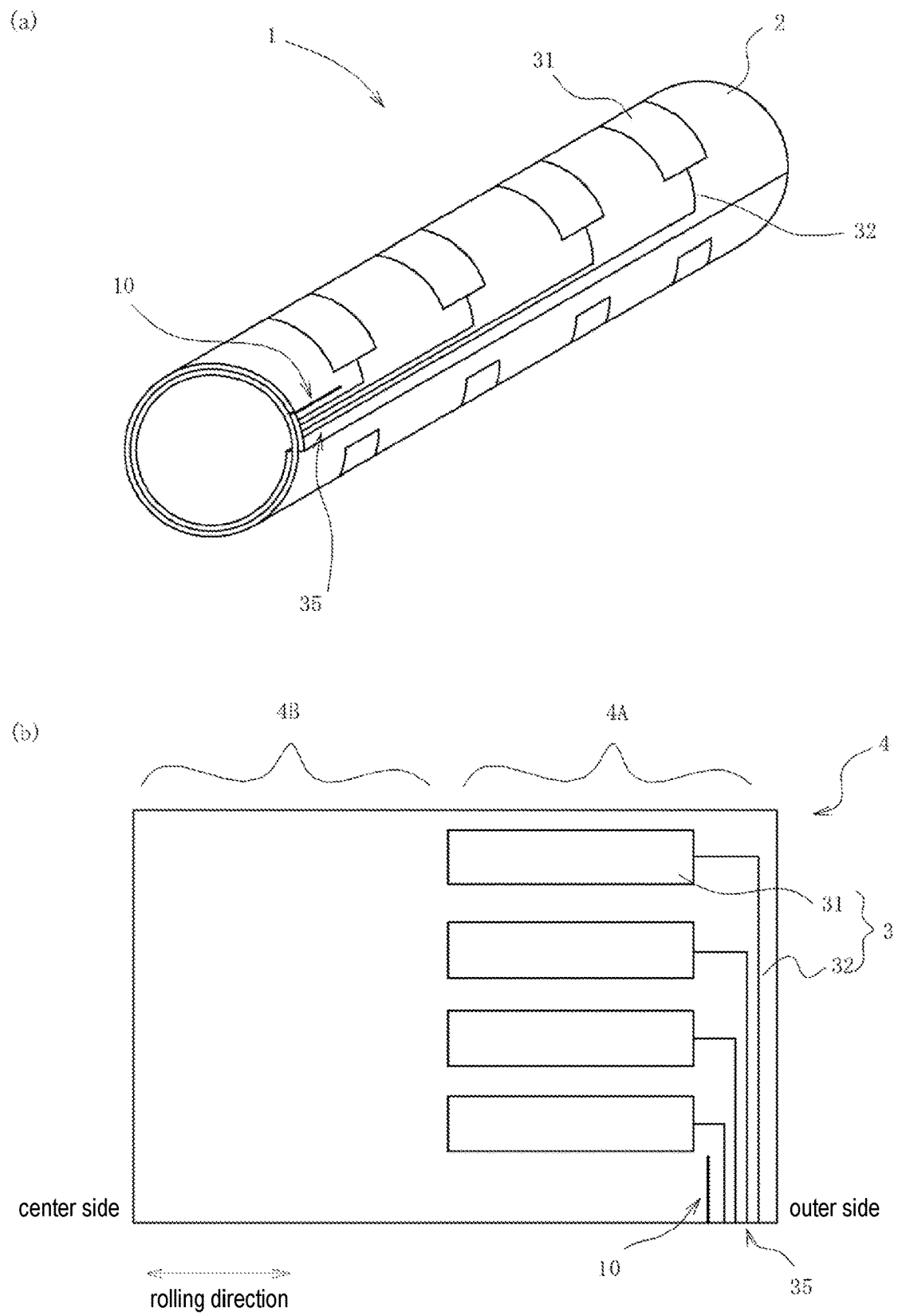

(a) of FIG. 22 is a perspective view showing another embodiment of the cylindrical printed board according to the present invention, and (b) of FIG. 22 is a plan view showing a printed board obtained by developing another embodiment of the cylindrical printed board according to the present invention.

Figure 23:
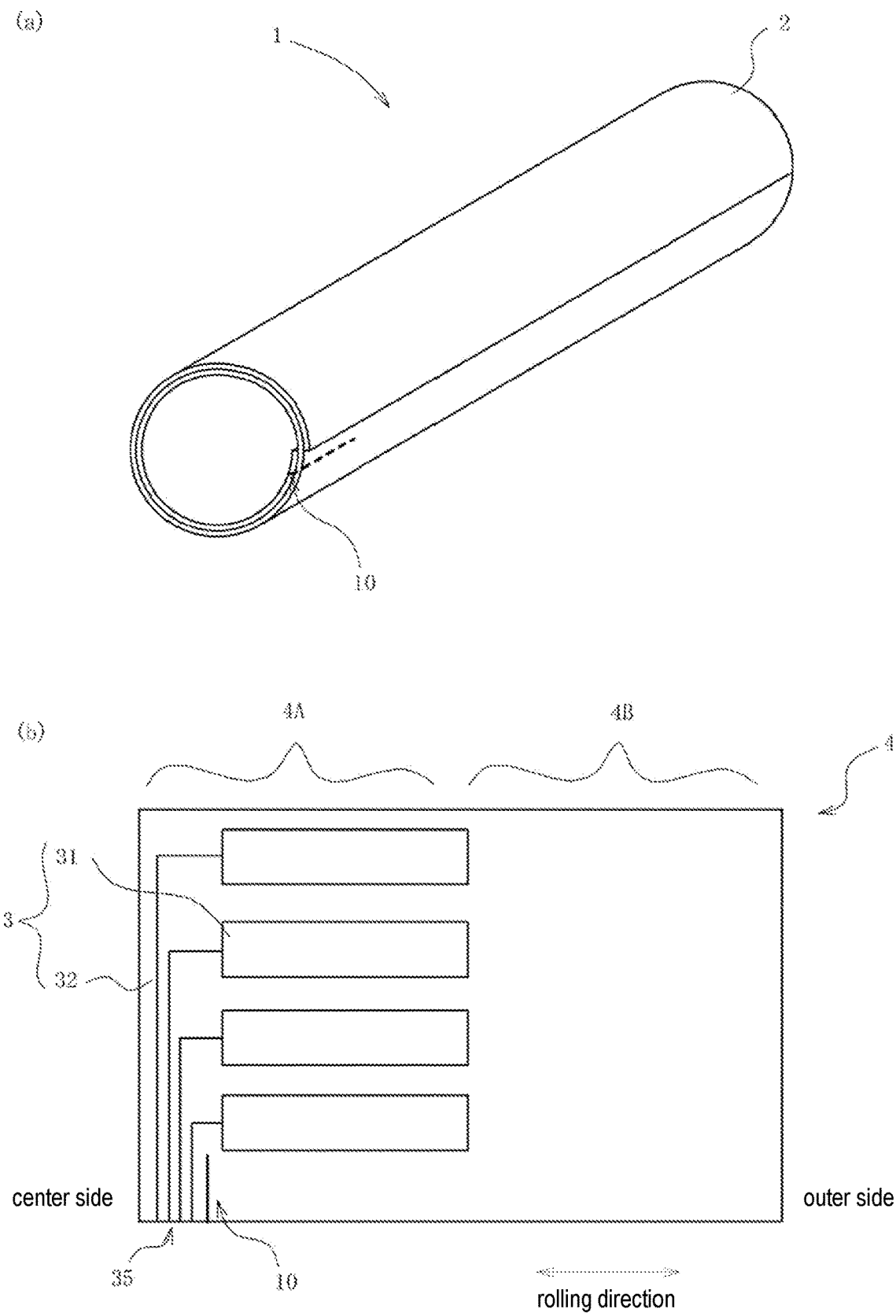

(a) of FIG. 23 is a perspective view showing another embodiment of the cylindrical printed board according to the present invention, and (b) of FIG. 23 is a plan view showing a printed board obtained by developing another embodiment of the cylindrical printed board according to the present invention.

Figure 24:
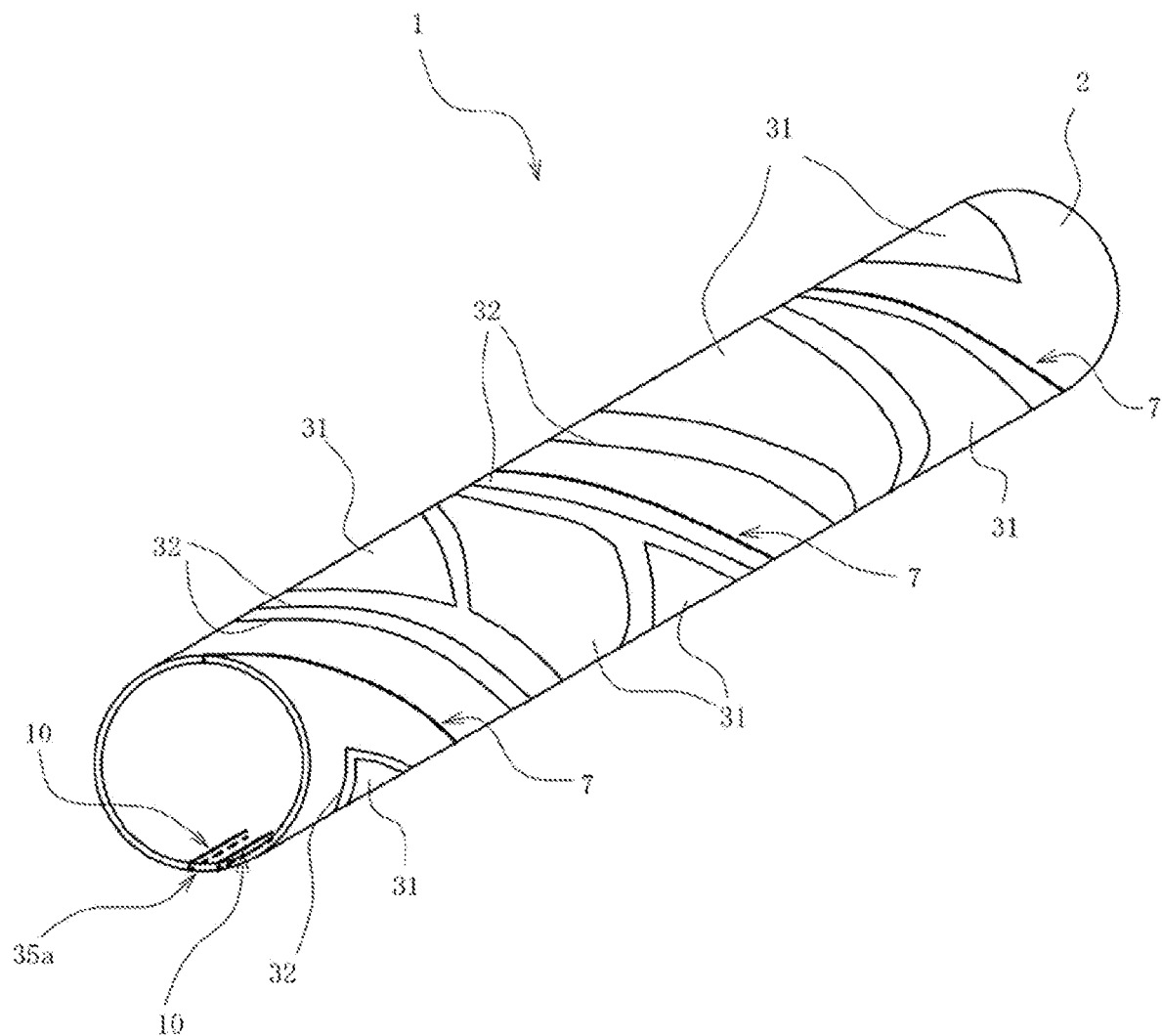

FIG. 24 is a perspective view showing another embodiment of the cylindrical printed board according to the present invention.

Figure 25:
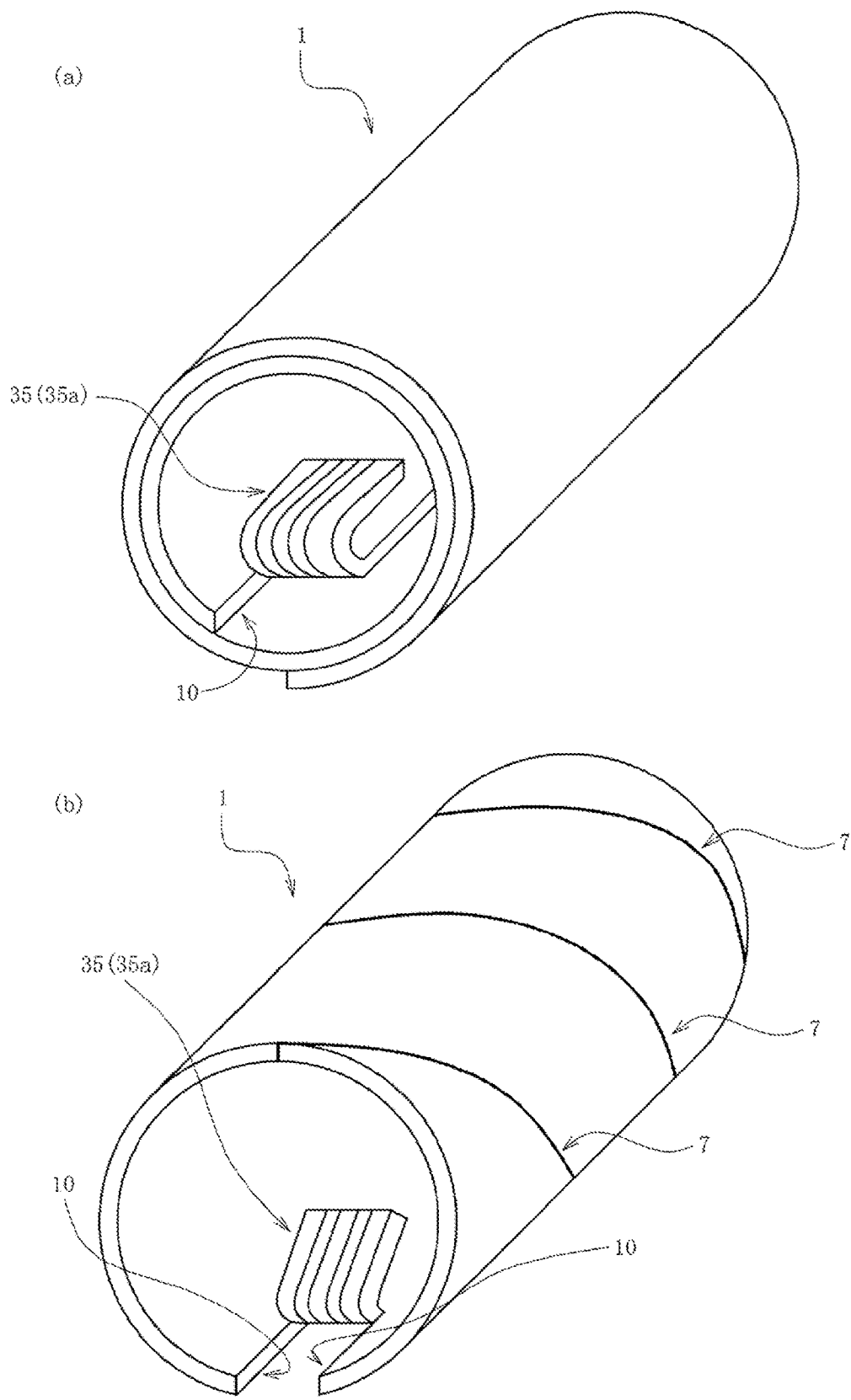

FIG. 25 is a perspective view showing another embodiment of the cylindrical printed board according to the present invention.

Figure 26:
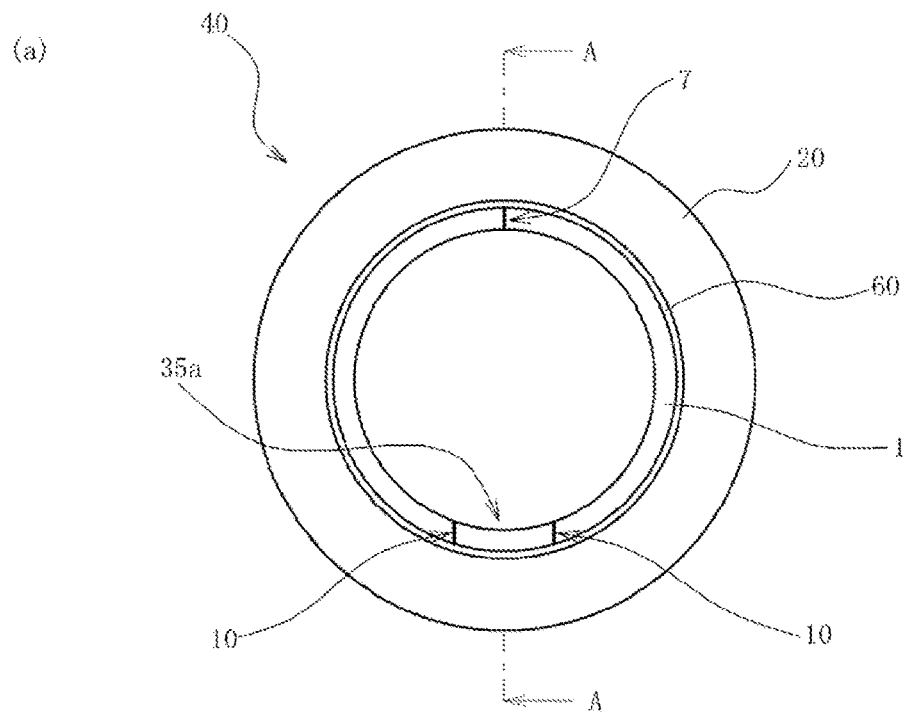
Figure 26:
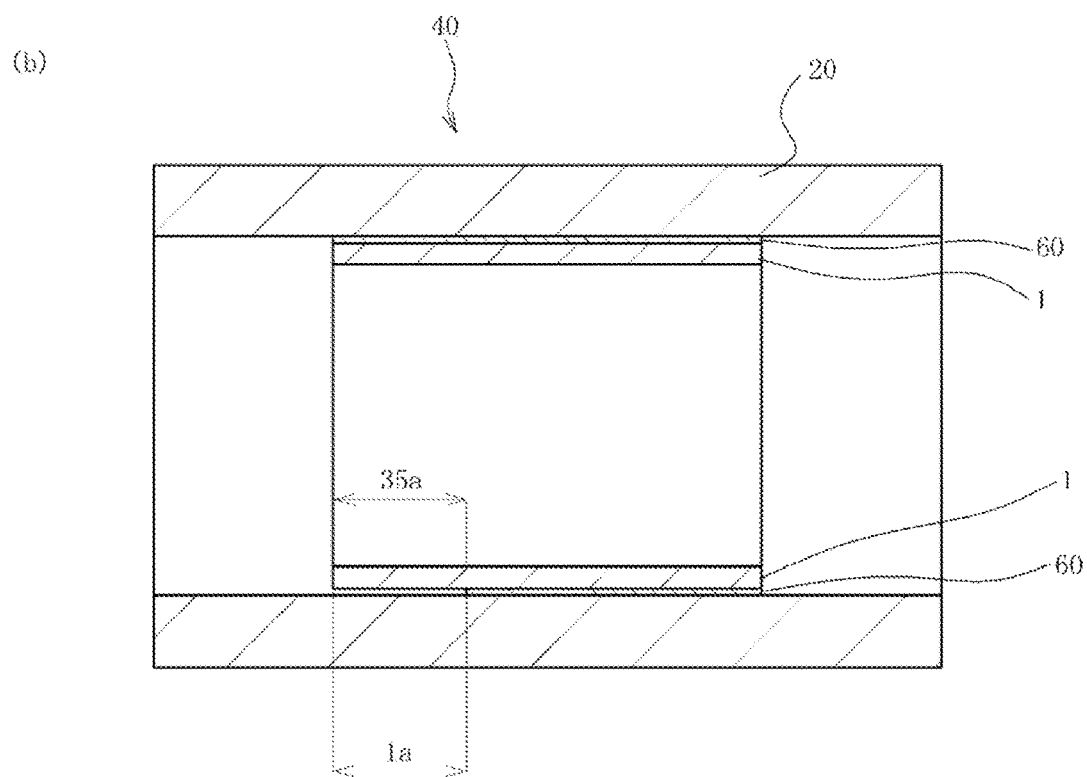

(a) of FIG. 26 is a side view showing another embodiment of the printed-board-integrated molded article according to the present invention, and (b) of FIG. 26 is a cross-sectional view showing a cross section A-A in (a) of FIG. 26.

Figure 27:
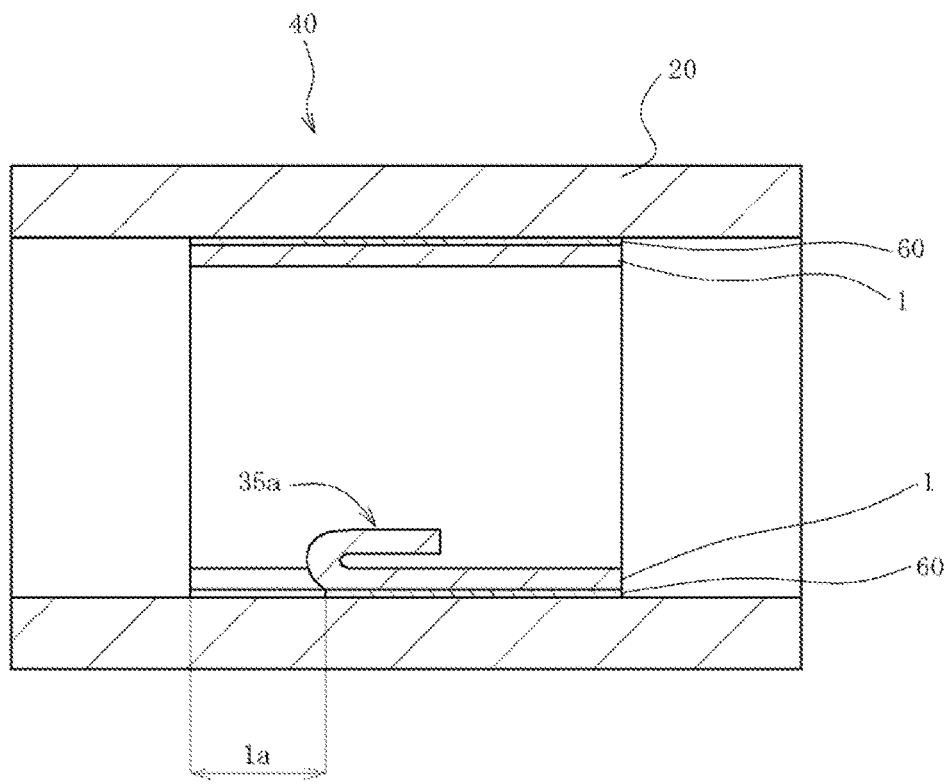

FIG. 27 is a cross-sectional view showing another embodiment of the printed-board-integrated molded article according to the present invention.

Figure 28:
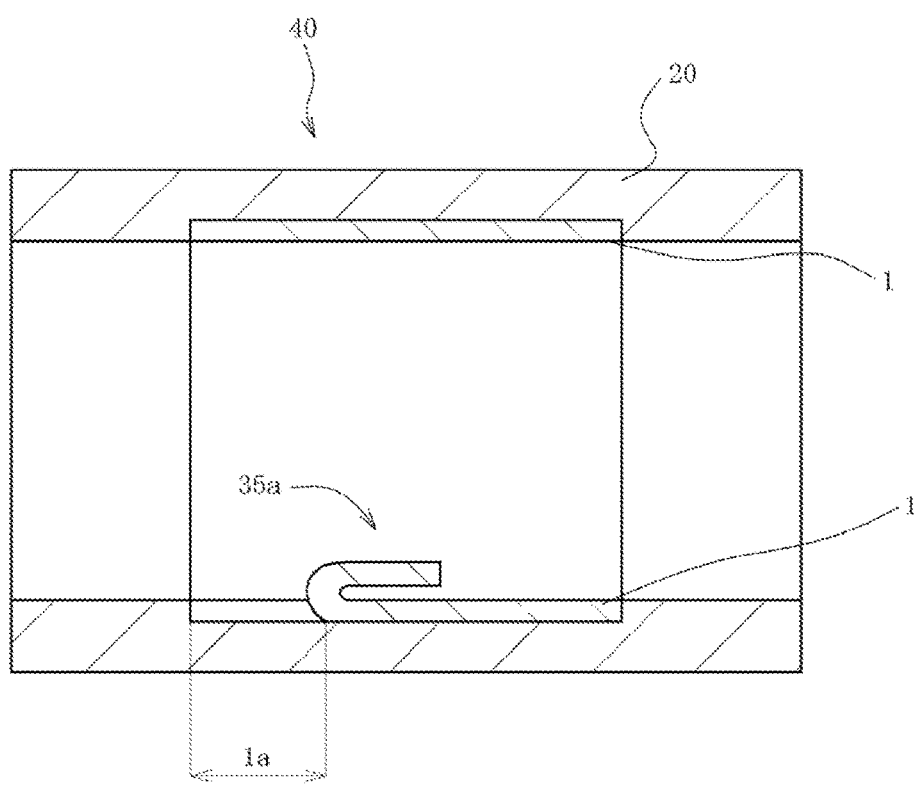

FIG. 28 is a cross-sectional view showing another embodiment of the printed-board-integrated molded article according to the present invention.

Figure 29:
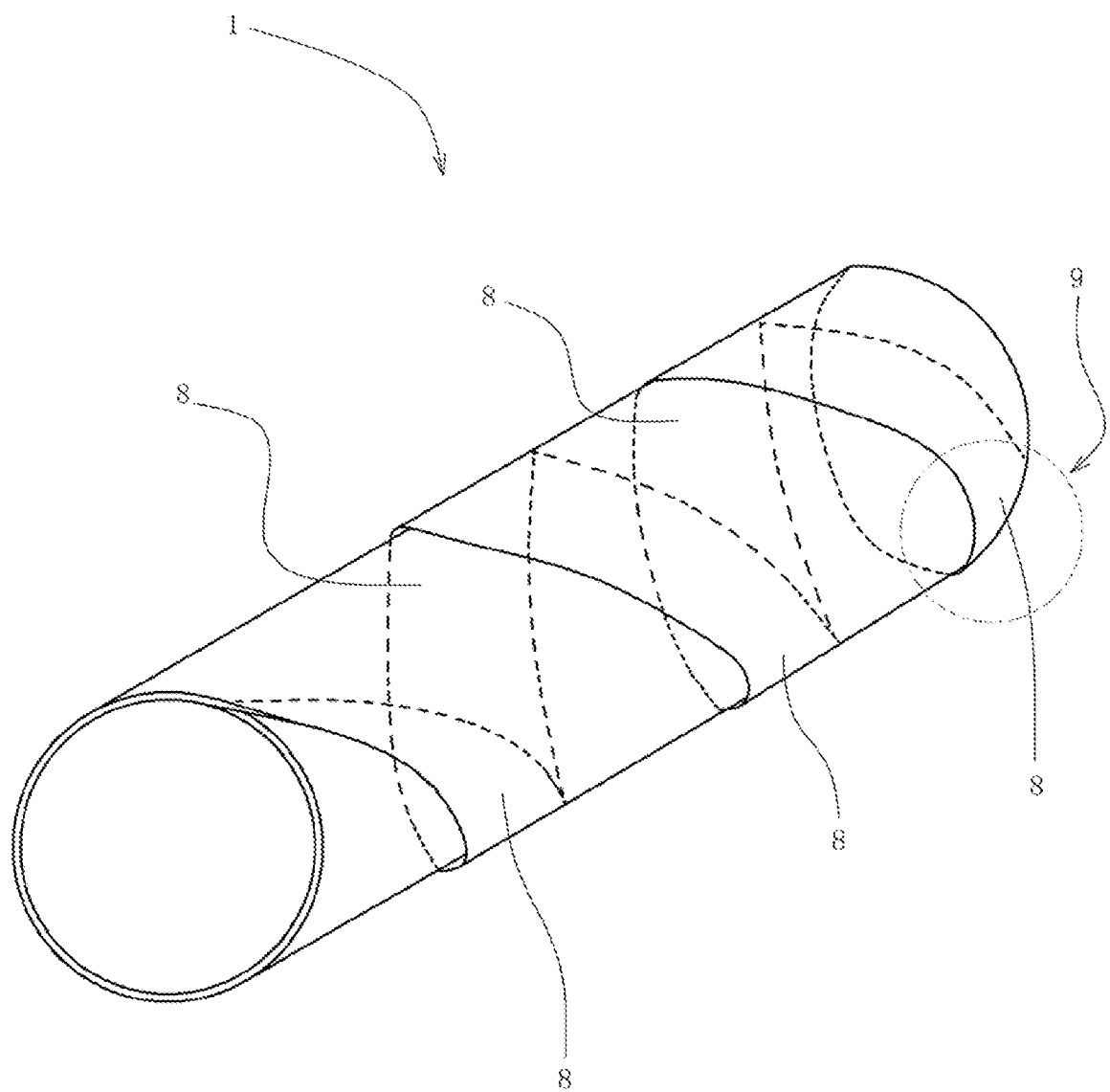

FIG. 29 is a perspective view showing another embodiment of the cylindrical printed board according to the present invention.

Figure 30:
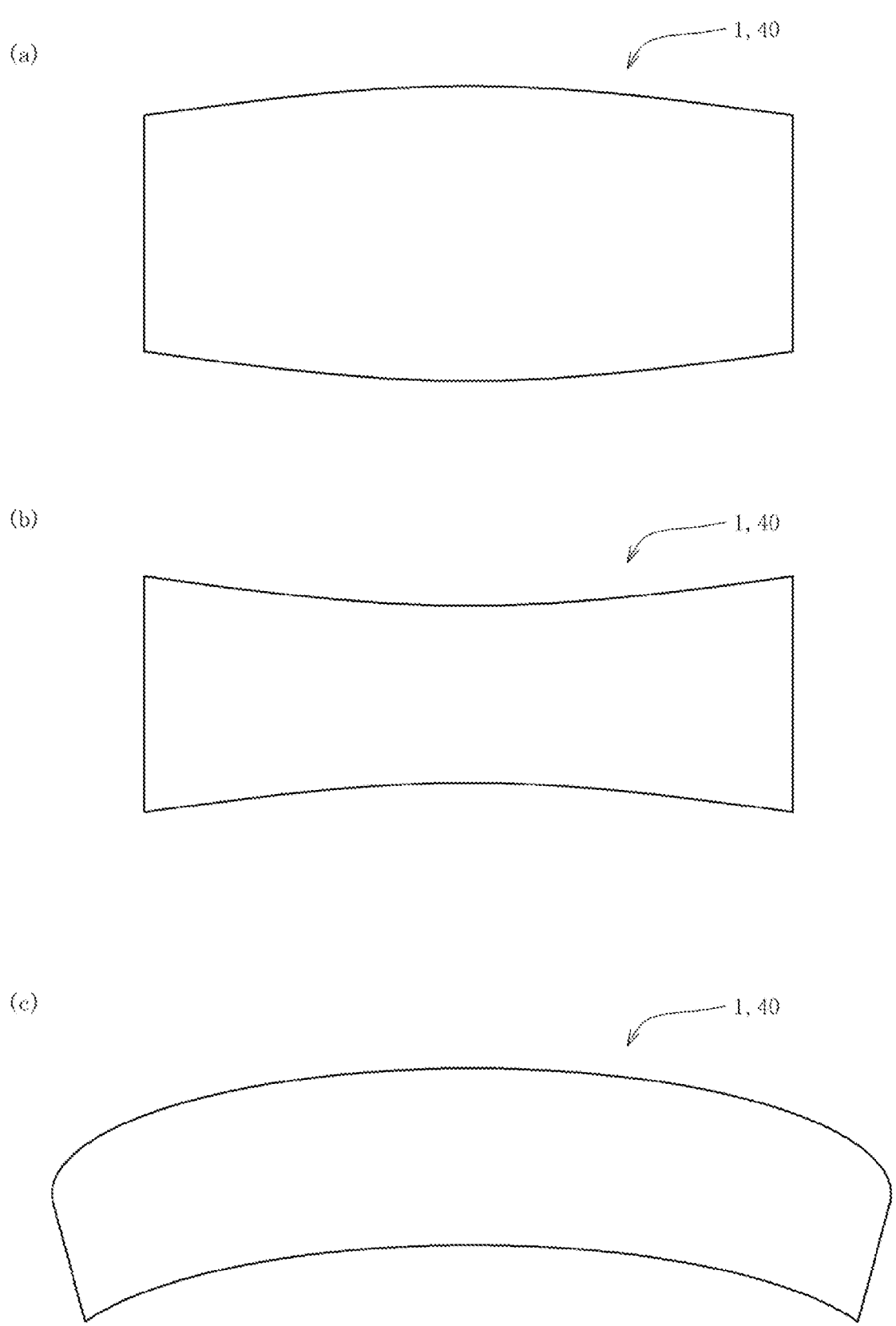

FIG. 30 is a front view showing another embodiment of the cylindrical printed board and the printed-board-integrated molded article according to the present invention.

Figure 31:
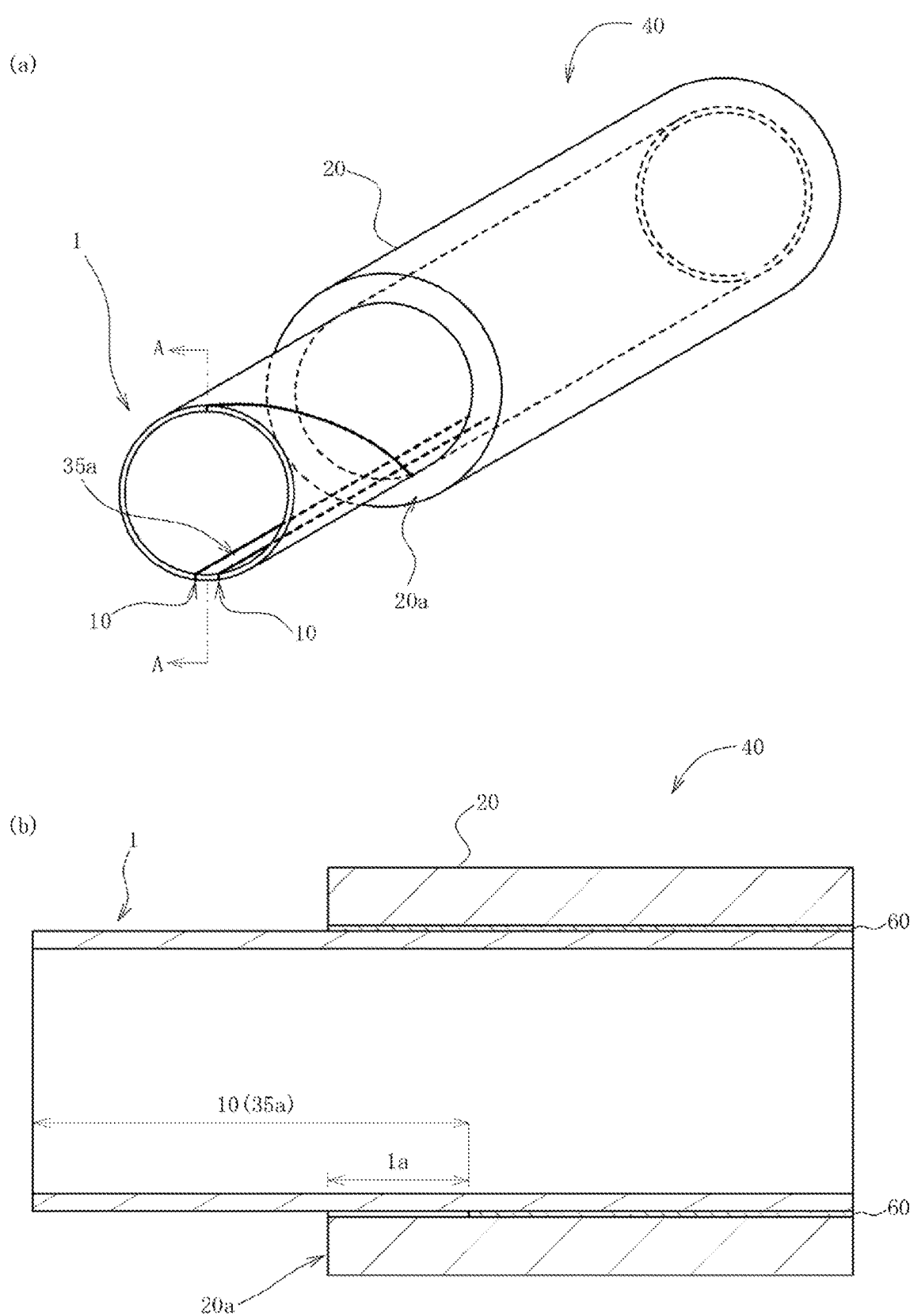

(a) of FIG. 31 is a perspective view showing another embodiment of the printed-board-integrated molded article according to the present invention, and (b) of FIG. 31 is a cross-sectional view showing a cross section A-A in (a) of FIG. 31.

Figure 32:
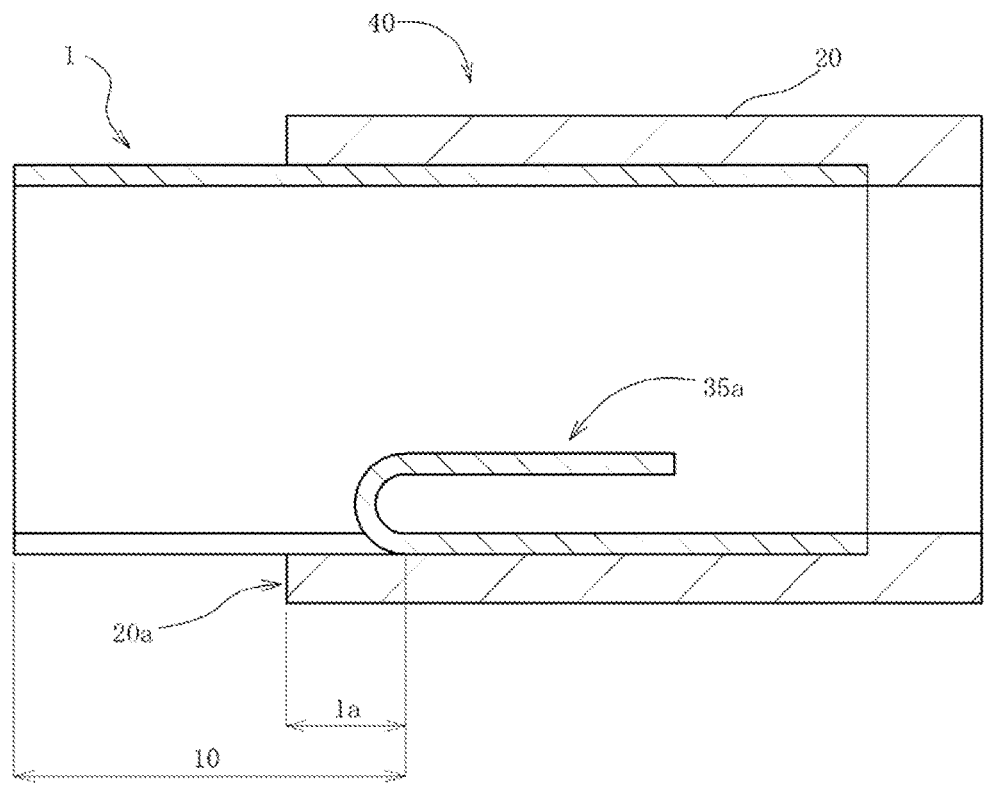

FIG. 32 is a cross-sectional view showing another embodiment of the printed-board-integrated molded article according to the present invention.

Figure 33:
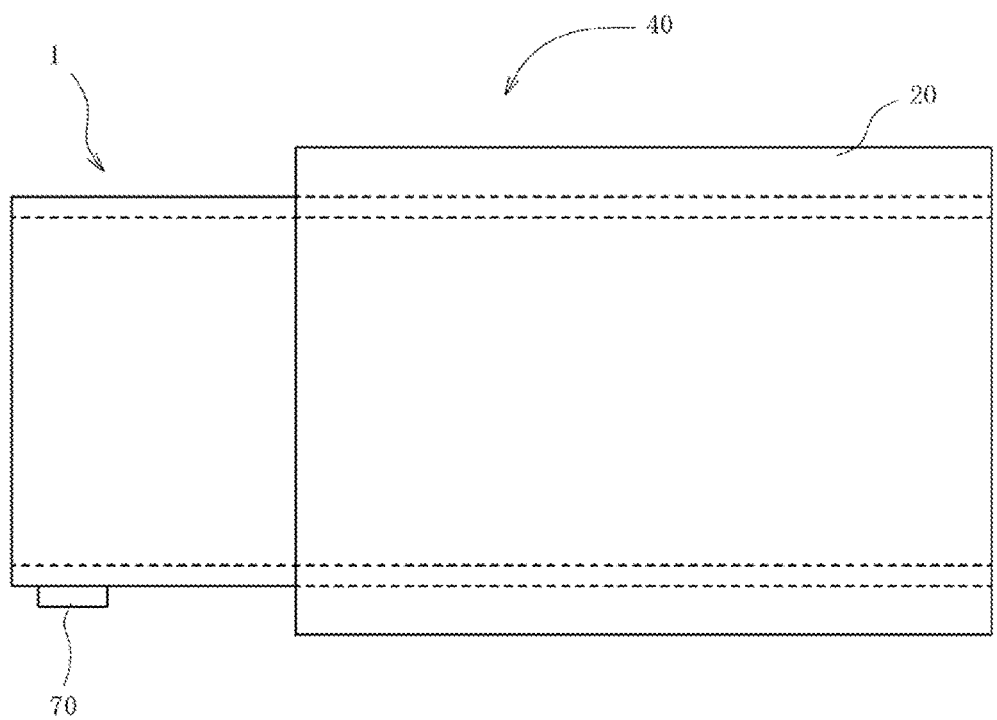

FIG. 33 is a front view showing another embodiment of the printed-board-integrated molded article according to the present invention.

Figure 34:
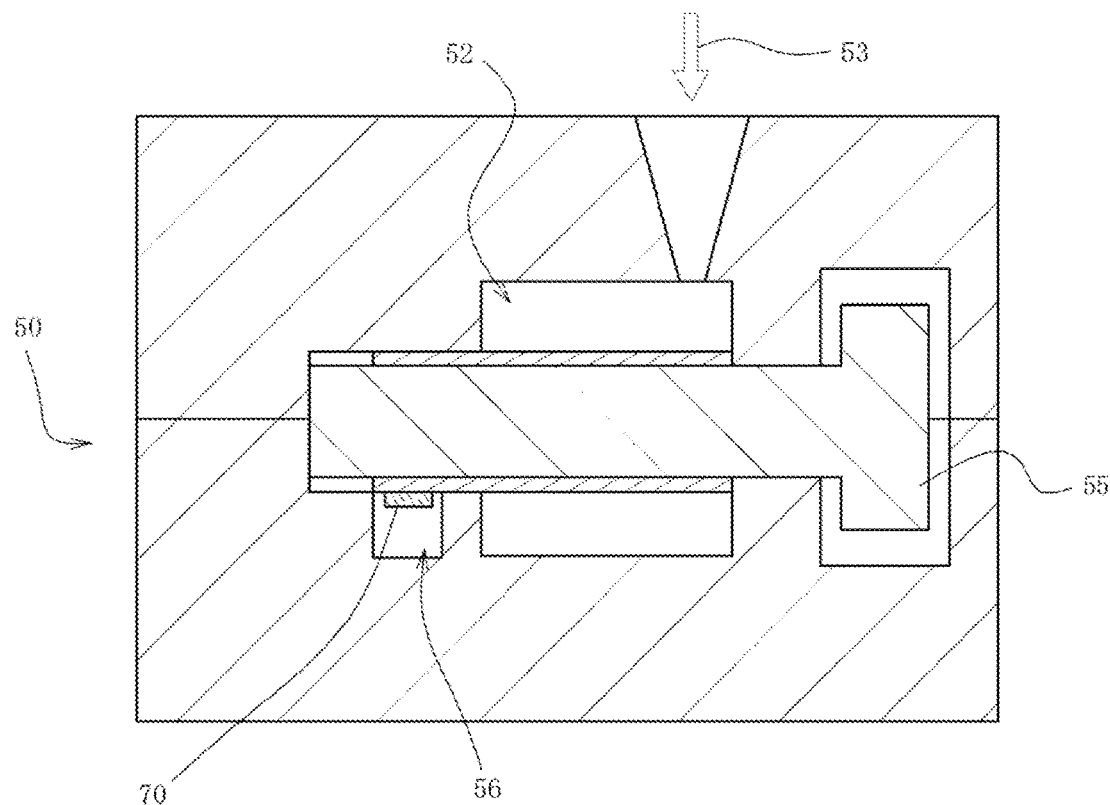

FIG. 34 is a cross-sectional view showing an example of a method for manufacturing the printed-board-integrated molded article shown in FIG. 33.

Figure 35:
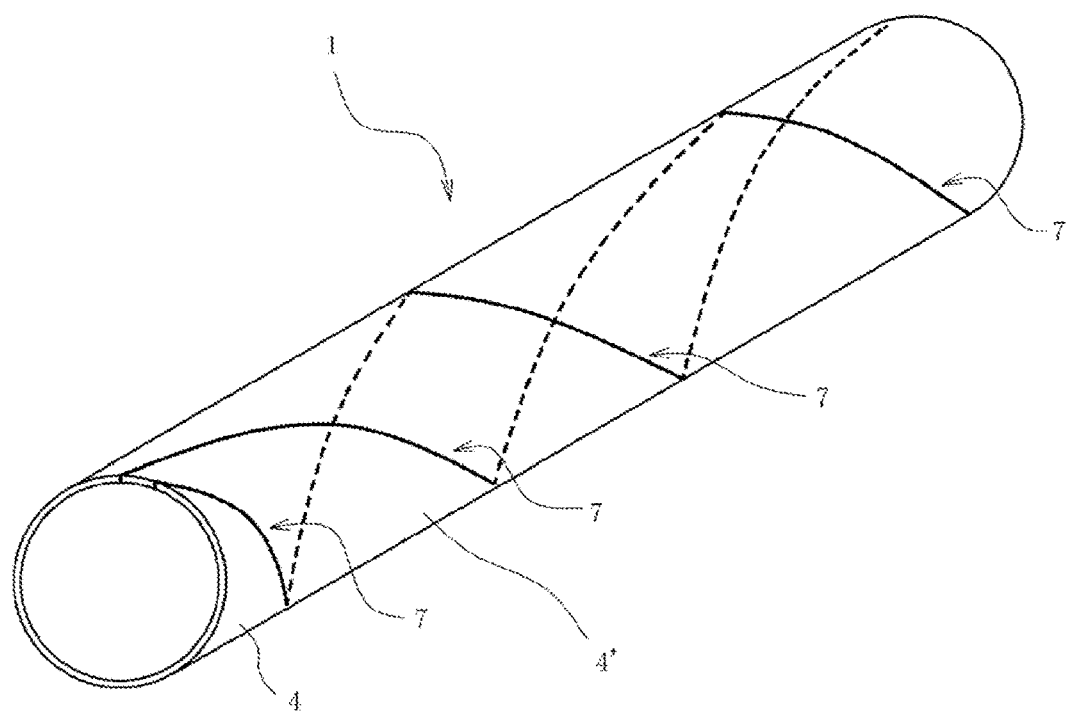

FIG. 35 is a perspective view showing another embodiment of the cylindrical printed board according to the present invention.

Figure 36:
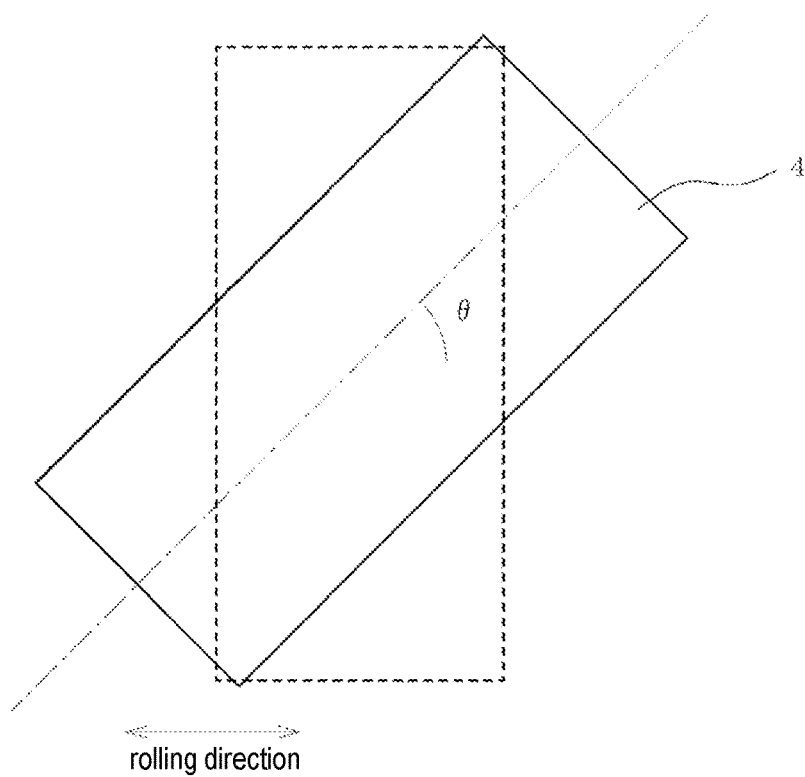

FIG. 36 is a plan view showing a printed board obtained by developing another embodiment of the cylindrical printed board according to the present invention.

Figure 37:
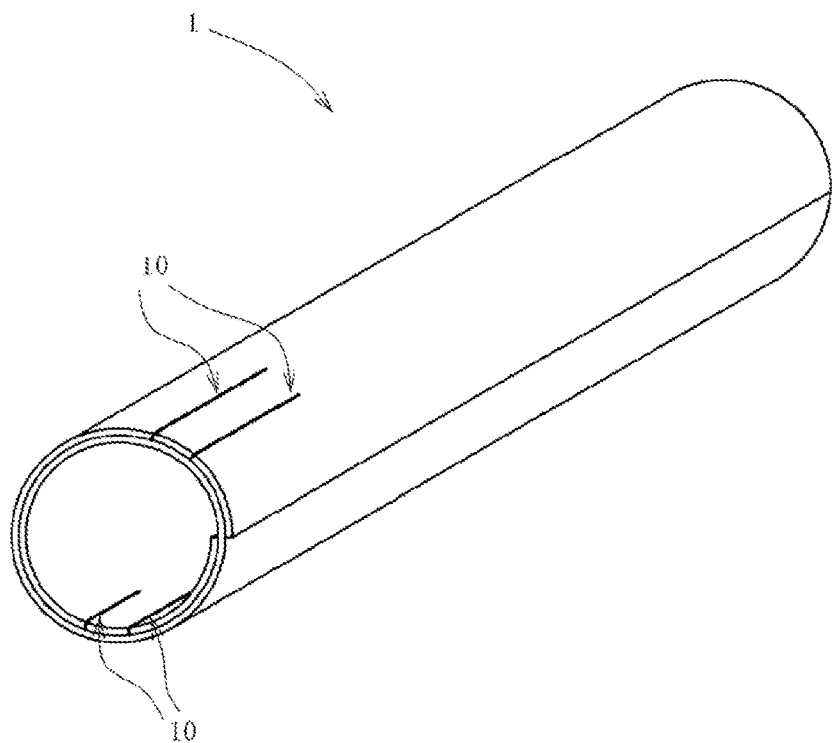

FIG. 37 is a perspective view showing another embodiment of the cylindrical printed board according to the present invention.

Figure 38:
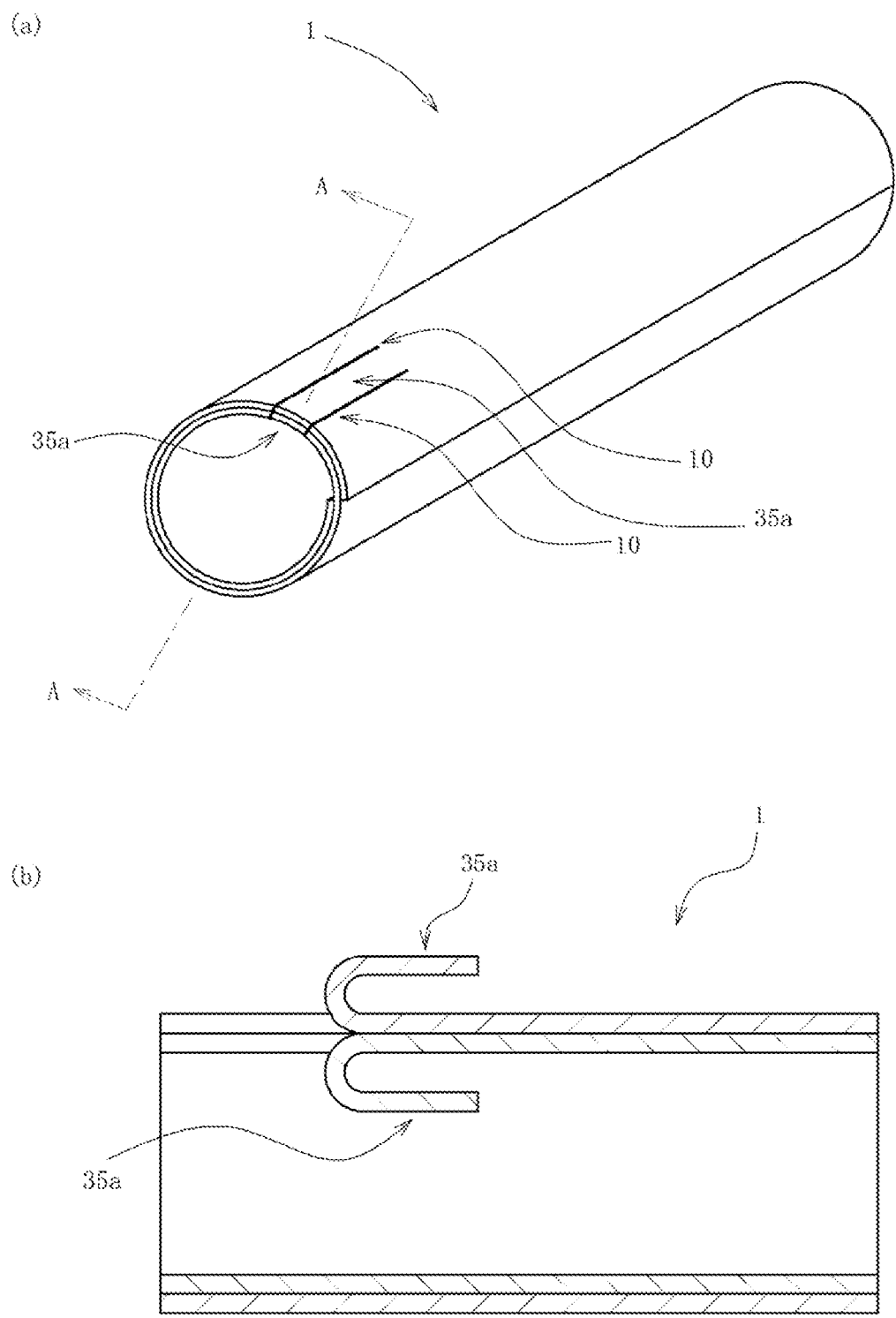

(a) of FIG. 38 is a perspective view showing another embodiment of the cylindrical printed board according to the present invention, and (b) of FIG. 38 is a cross-sectional view showing a cross section A-A in (a) of FIG. 38.

Figure 39:
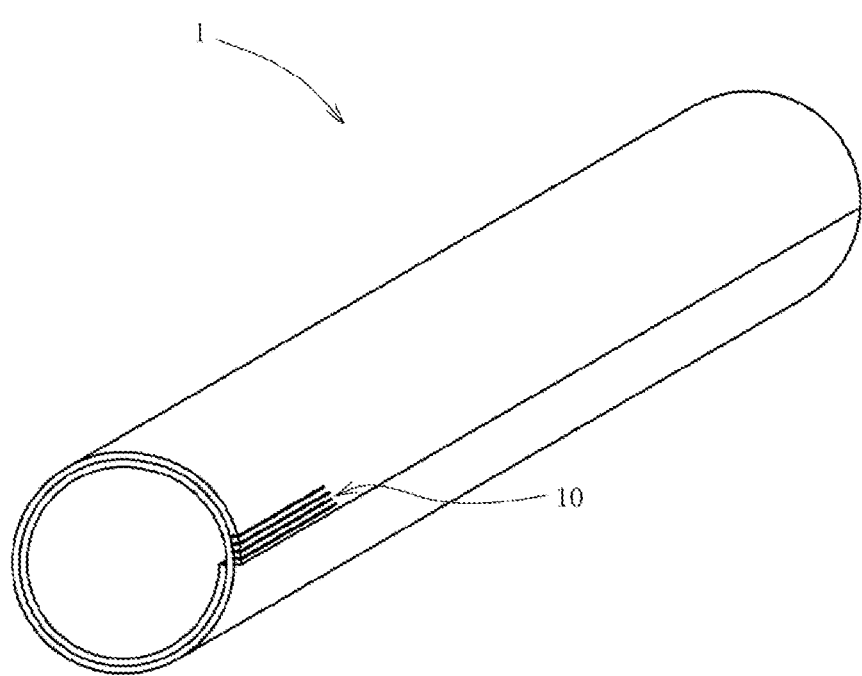
Figure 39:
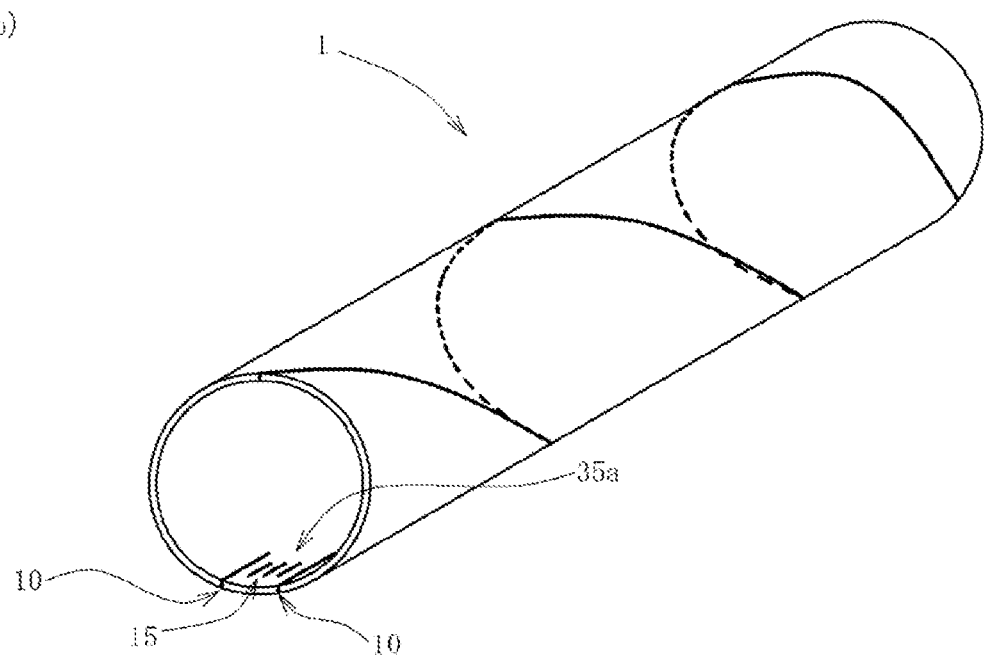

FIG. 39 is a perspective view showing another embodiment of the cylindrical printed board according to the present invention.

DESCRIPTION OF THE EMBODIMENTS

First Embodiment

Embodiments of a cylindrical printed board according to the present invention are described with reference to the drawings. The cylindrical printed board according to the embodiment is included in an electronic device such as a wearable device, a portable game device, or the like, and functions as a touch sensor, a pressure sensor, an antenna, a heater, a cable harness, or the like. In the embodiment, a cylindrical printed board that functions as a touch sensor and is mounted on a wearable device (earphone) which is a kind of electronic device is described as an example.

Figure 17:
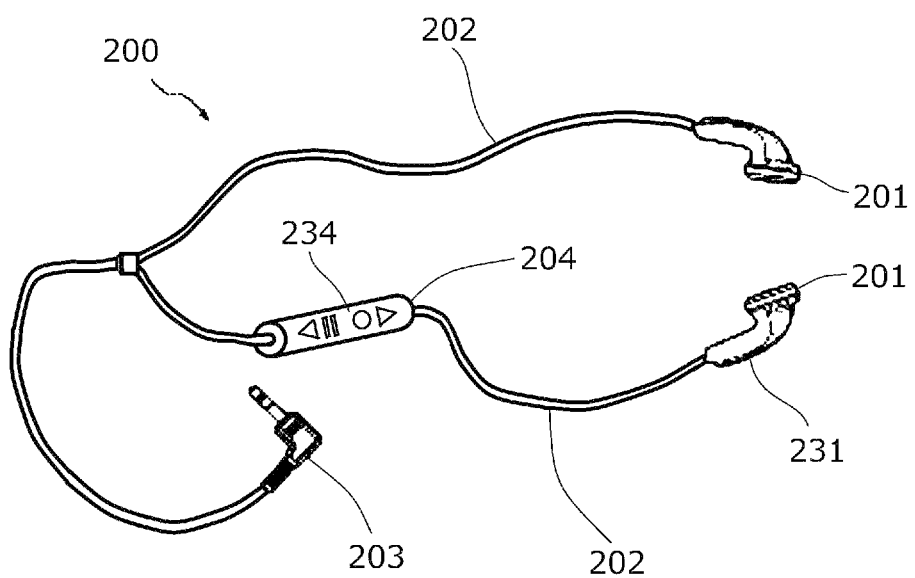
FIG. 17 is a schematic diagram showing an earphone having a remote controller.
Figure 18:
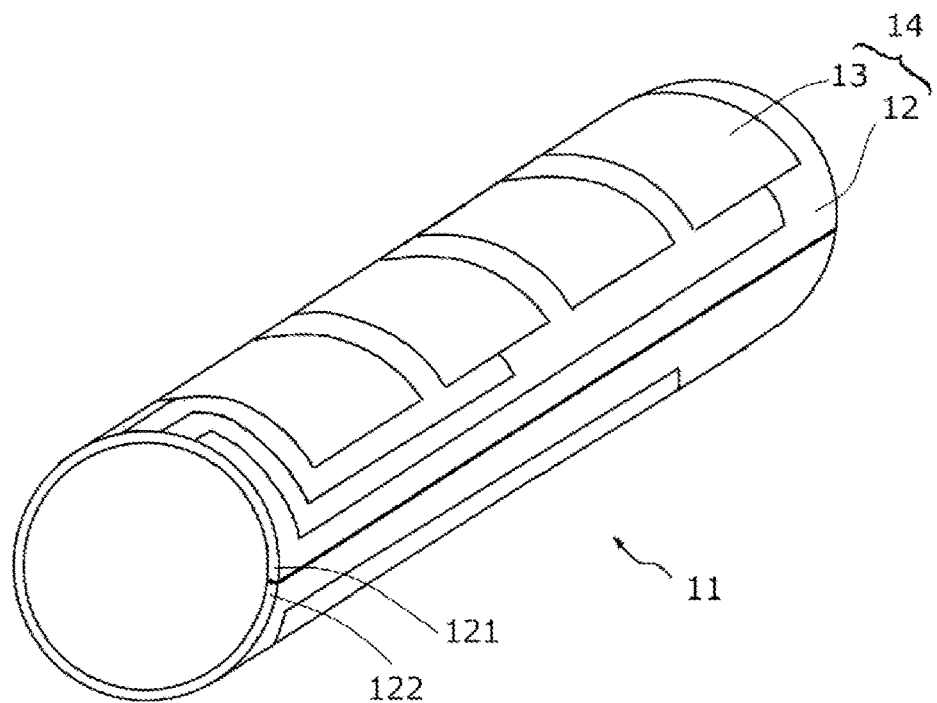
FIG. 18 is a perspective view showing a cylindrical printed board obtained by being bent in a manner that one side and an opposite side of an insulator substrate abut against each other.
Figure 19:
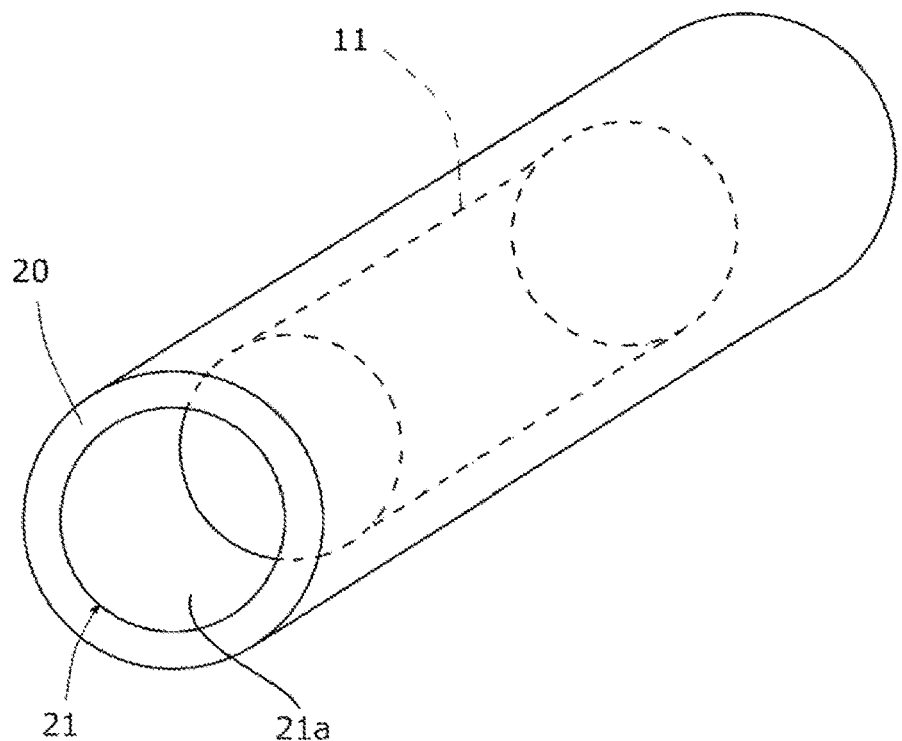
FIG. 19 is a perspective view showing a casing in which the cylindrical printed board in FIG. 18 is stored.
Figure 20:
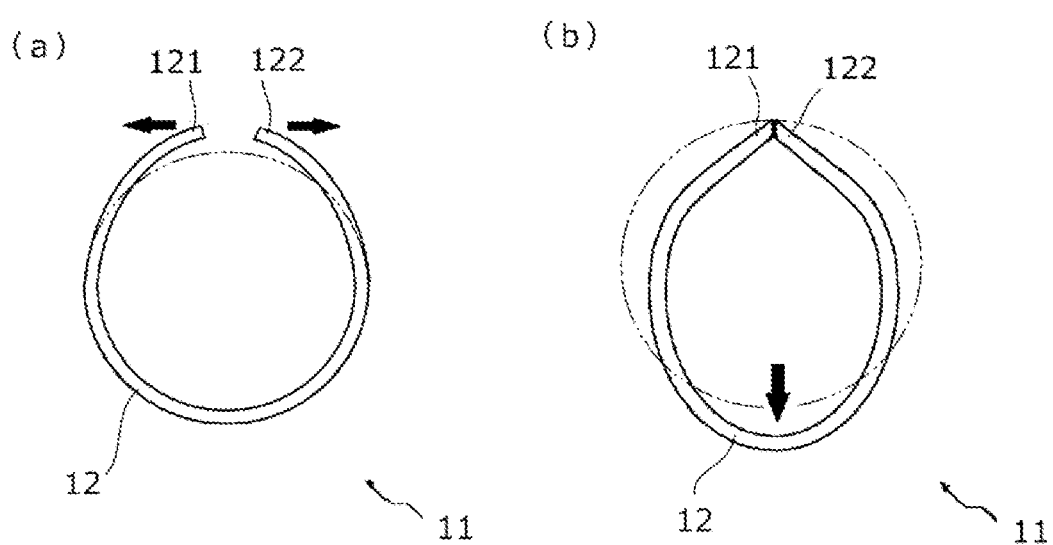
FIG. 20 is an end view showing an example of a defect that occurs in the cylindrical printed board in FIG. 18.

An earphone 200 shown in FIG. 17 includes a set of two earpieces 201 that can be inserted into ears of a user, and a remote controller 204 that controls one or more functions of an apparatus. By inserting a plug 203 into a socket of the apparatus (not shown), both the remote controller 204 and the earpiece 201 are connected to the apparatus. The remote controller 204 is normally included in a wire 202 somewhere between the earpiece 201 and the plug 203, and performs control by the user touching a casing including a touch sensor 234, for example to adjust the volume, skip to the previous/next song, fast forward/rewind the song, and the like. A cylindrical printed board 1 of the embodiment is stored in the cylindrical casing of the remote controller 204.

1. Cylindrical Printed Board

Figure 1:
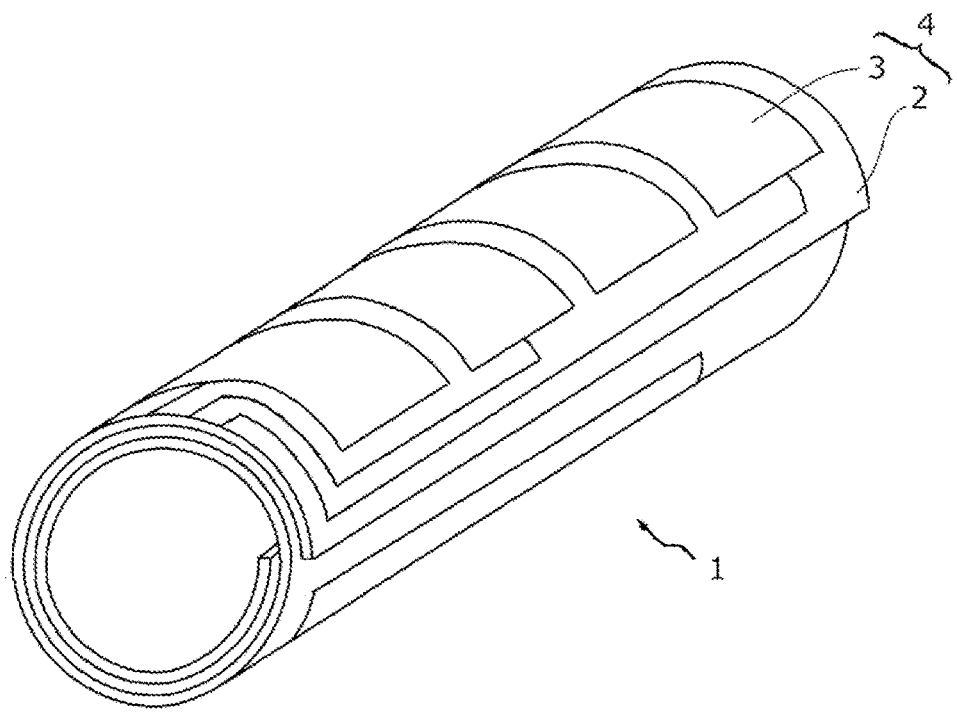
FIG. 1 is a perspective view showing an embodiment of a cylindrical printed board according to the present invention.
Figure 2:
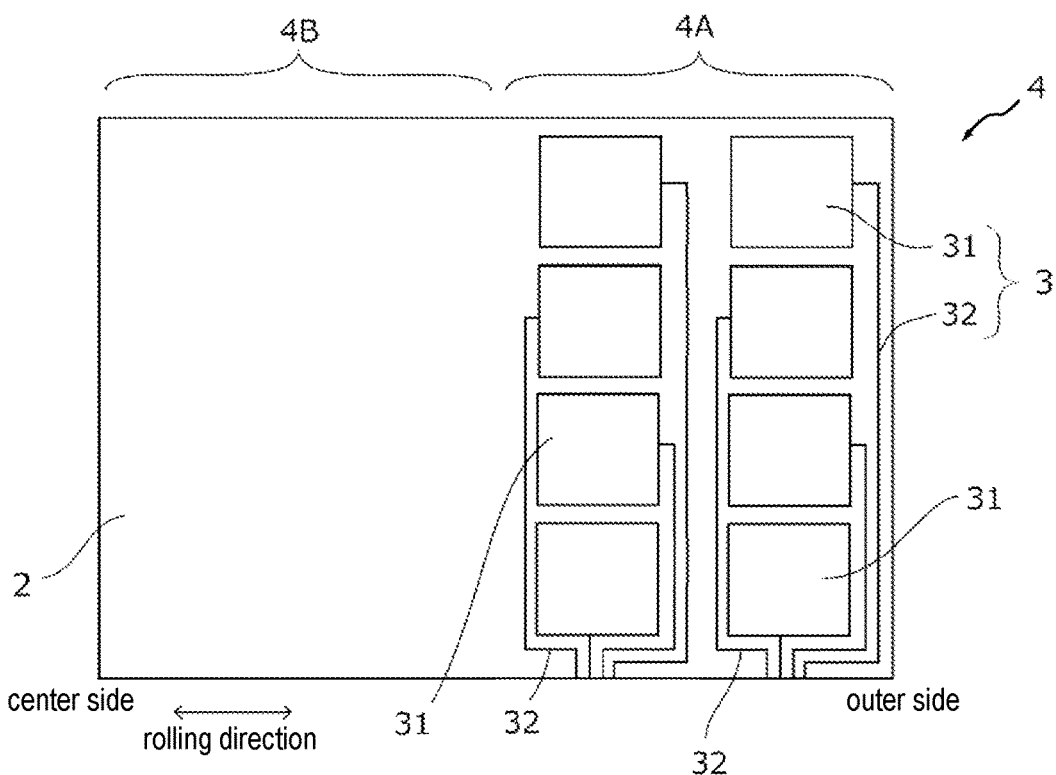
FIG. 2 is a plan view showing a printed board obtained by developing the cylindrical printed board in FIG. 1.

FIG. 1 is a perspective view showing an embodiment of the cylindrical printed board according to the present invention. FIG. 2 is a plan view showing a printed board obtained by developing the cylindrical printed board in FIG. 1.

As shown in FIG. 1, the cylindrical printed board 1 of the embodiment is a printed board 4 that includes an insulator substrate 2 and a conductor pattern 3 formed on the insulator substrate 2 and constituting a touch sensor portion, and the printed board 4 is rolled beyond one full circle to form a cylindrical shape. The cylindrical printed board 1 shown in FIG. 1 is rolled two full circles. Note that, in the specification, in order to make the drawings easier to see, the cylindrical printed board 1 is drawn in a manner that a gap corresponding to a thickness of the insulator substrate 2 is opened in overlapping parts of the printed board 4, but the overlapping parts may be in close contact with each other without any gap.

The cylindrical printed board 1 has a rectangular shape in a state of being developed (see FIG. 2).

The cylindrical printed board 1 is rolled beyond one full circle in a direction parallel to one side of the printed board 4. The direction parallel to one side is a rolling direction of the printed board 4. The printed board is overlapped and rolled in an entire direction orthogonal to the rolling direction. In other words, the printed board is overlapped and rolled entirely along an axial direction of the cylindrical printed board 1.

The insulator substrate 2 is preferably configured by a material having excellent moldability (rolling processing), insulation properties, and the like. Materials satisfying this requirement may be, for example, general-purpose resins such as a polyethylene terephthalate resin, an acrylic resin, and the like; general-purpose engineering resins such as a polyacetal resin, a polycarbonate resin, and the like; super engineering resins such as a polysulfone resin, a polyphenylene sulfide resin, and the like; or laminated resins thereof. The thickness of the insulator substrate 2 can be set to, for example, 25 μm to 100 μm. Considering an ease of moldability (rolling processing), the thickness is preferably thin. In the embodiment, the insulator substrate 2 is configured by a polyethylene terephthalate film of 50 μm.

The conductor pattern 3 constituting the touch sensor portion has a plurality of sensor electrodes 31 including a conductive thin film formed on a surface 2a of the insulator substrate 2 on an outer peripheral side of the insulator substrate 2. The sensor electrodes 31 are arranged at a plurality of positions corresponding to a switch design of the remote controller 204. A sensor wiring 32 is connected to each of the sensor electrodes 31, and further connected to an external control circuit via a FPC (not shown).

The sensor electrode 31 is configured by a material of which an electrostatic capacity changes according to proximity/separation of a non-detectable object (a conductor such as a finger of the user, or the like) and which has excellent moldability (rolling processing). For example, a metal such as gold, silver, copper, iron, nickel, chromium, or the like is used.

In addition, when the remote controller 204 arranges an illumination or display for operation display on the inner side of the cylindrical printed board 1, the sensor electrode 31 is preferably configured by a material having excellent transparency. Materials satisfying this requirement may be, for example, metal oxides such as a tin oxide, an indium oxide, an antimony oxide, a zinc oxide, a cadmium oxide, an indium tin oxide (ITO), and the like. In addition, when elongation is required, in addition to a silver nanowire and a carbon nanotube, a conductive polymer such as PEDOT or the like can also be used. In addition, the sensor electrode 31 may be a mesh electrode using the metal described above. The mesh electrode has a mesh-like or lattice-like shape configured by fine lines.

When the sensor electrode 31 is a conductive film configured by these materials, a thickness of the sensor electrode 31 can be set to, for example, 5 nm to 10000 nm.

The sensor wiring 32 is formed around the sensor electrode 31 and in a gap between the sensor electrodes 31. The sensor wiring 32 preferably uses the same material as the sensor electrode 31 and is arranged to be continuous with the sensor electrode 31.

A method for forming the sensor electrode 31 and the sensor wiring 32 may be, for example, a method in which a conductive film including the electrode and the wiring material described above is formed entirely on the insulator substrate 2 in a state of being developed, and then unnecessary parts are removed by etching. The conductive film can be formed entirely by performing, for example, a vacuum deposition method, a sputtering method, an ion plating method, a CVD method, a roll coater method, or the like. The etching can be performed by forming a resist on a part to be left as an electrode with a photolithography method, a screen-printing method, or the like, and then immersing the resist in an etching solution such as hydrochloric acid, or the like. In addition, the etching can also be performed in a manner that after the resist is formed, the etching solution is sprayed to remove a conductive film in a part where the resist is not formed, and then the resist is swelled or dissolved to be removed by immersing the resist in a solvent. In addition, the etching can also be performed by a laser.

In addition, the sensor wiring 32 may be separately formed by screen printing using a silver paste or the like after the sensor electrode 31 is formed.

The cylindrical printed board 1 includes the insulator substrate 2 and the conductor pattern 3 as described above, and uses the printed board 4 in a state of being developed to be formed into a cylindrical shape by rolling processing. In a case of the cylindrical printed board 1 shown in FIG. 1, the printed board 4 is rolled two full circles with a surface on which the conductor pattern 3 is formed facing the outer peripheral side. Besides, the cylindrical shape is a columnar shape in which a diameter of the printed board 4 rolled into a cylindrical shape is the same at both ends of the cylinder. A known method can be used as a method for the rolling processing. For example, the printed board 4 in a state of being developed, that is, a flat printed board 4, is heated to below a softening point of the insulator substrate 2 (generally, 10 to 20° C. below the softening point), wrapped around a rod-shaped jig, and then cooled and taken out.

Because the printed board 4 is rolled beyond one full circle to form a cylindrical shape, even if a force acts to restore the insulator substrate 2 rolled in a cylindrical shape to an original shape by rigidity of the insulator substrate 2, a return of the rolling processing is suppressed by friction in an overlapping region of the printed board 4. In addition, because the overlapping regions of the printed board 4 are in contact with each other by a surface, the overlapping regions do not serve as a fulcrum for distortion such as butt. Thus, the cylindrical printed board 1 can maintain a processing shape.

In addition, the cylindrical printed board 1 shown in FIGS. 1 and 2 includes: a conductor pattern forming region 4A in which the conductor pattern 3 is formed on the insulator substrate 2; and a conductor pattern non-forming region 4B which is adjacent to a center side of the conductor pattern forming region 4A in the rolling direction and in which the conductor pattern 3 is not formed on the insulator substrate 2. That is, within the printed board 4 rolled two full circles, an outer circle is the conductor pattern forming region 4A, and an inner circle is the conductor pattern non-forming region 4B. In this way, the conductor pattern non-forming region 4B that does not contribute to a touch sensor function is rolled one full circle, and thereby a strength of the cylindrical printed board 1 is increased, and the cylindrical printed board is not easily crushed even when an external force is applied. Thus, a reliability of the touch sensor function is improved.

2. Printed-Board-Integrated Molded Article

Figure 3:
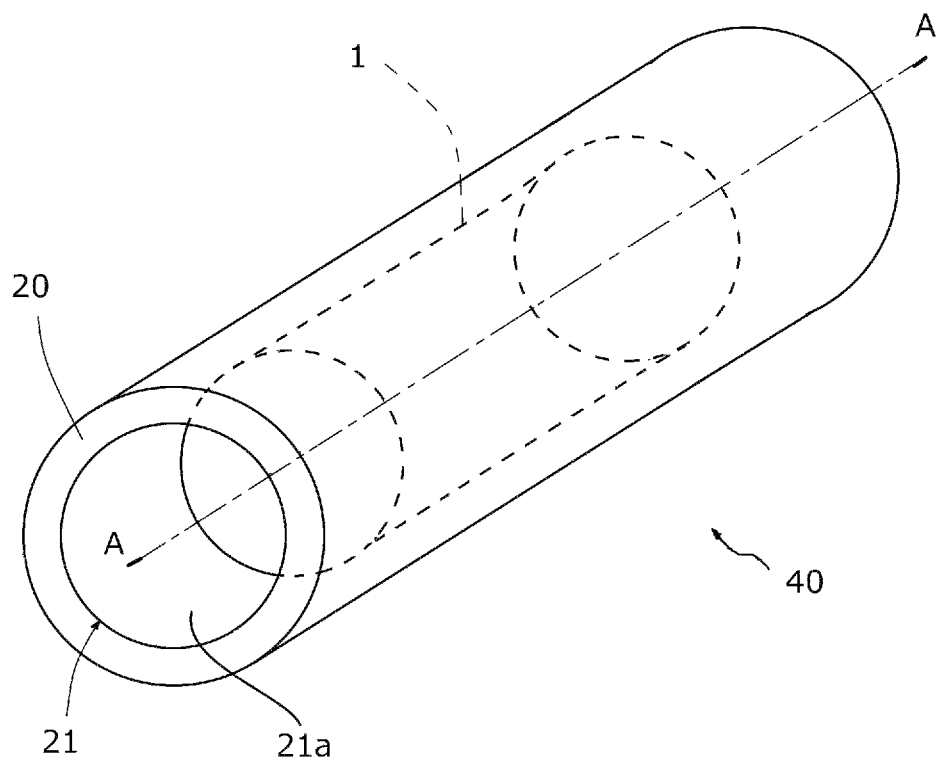
FIG. 3 is a perspective view showing an embodiment of a printed-board-integrated molded article according to the present invention.
Figure 4:
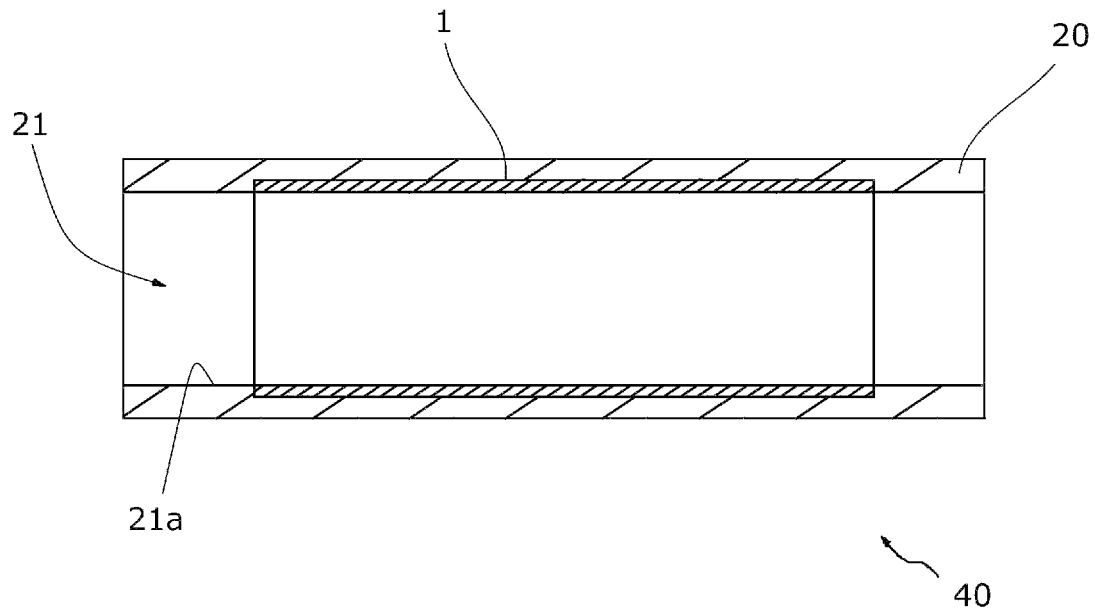
FIG. 4 is a cross-sectional view showing a cross section A-A of the printed-board-integrated molded article in FIG. 3.

FIG. 3 is a perspective view showing an embodiment of a printed-board-integrated molded article according to the present invention. FIG. 4 is a cross-sectional view showing a cross section A-A of the printed-board-integrated molded article in FIG. 3.

As shown in FIGS. 3 and 4, the cylindrical printed board 1 of the embodiment is integrated with a molded article 20 constituting a casing of the remote controller 204 which is a component part of the earphone 200 to form a printed-board-integrated molded article 40. Moreover, in FIGS. 3 and 4, the cylindrical printed board 1 is simplified for easy viewing.

The molded article 20 constituting the casing of the remote controller 204 is a cylindrical member as a whole. Because the casing of the remote controller 204 has a cylindrical shape, an operation surface of the touch sensor 234 is included on the entire outer peripheral surface of the casing. The operation surface is a surface that is touched (to be operated) by a finger of the user or the like when the user inputs a predetermined operation to the remote controller 204.

Materials of the molded article 20 may be general-purpose resins such as a polystyrene resin, a polyolefin resin, an ABS resin, an AS resin, an AN resin, and the like. In addition, general-purpose engineering resins such as a polyphenylene oxide polystyrene resin, a polycarbonate resin, a polyacetal resin, an acrylic resin, a polycarbonate-modified polyphenylene ether resin, a polybutylene terephthalate resin, an ultra-high molecular weight polyethylene resin, and the like, and super engineering resins such as a polysulfone resin, a polyphenylene sulfide resin, a polyphenylene oxide resin, a polyallylate resin, a polyetherimide resin, a polyimide resin, a liquid crystal polyester resin, a polyaryl heat resistant resin, and the like can also be used.

Figure 5:
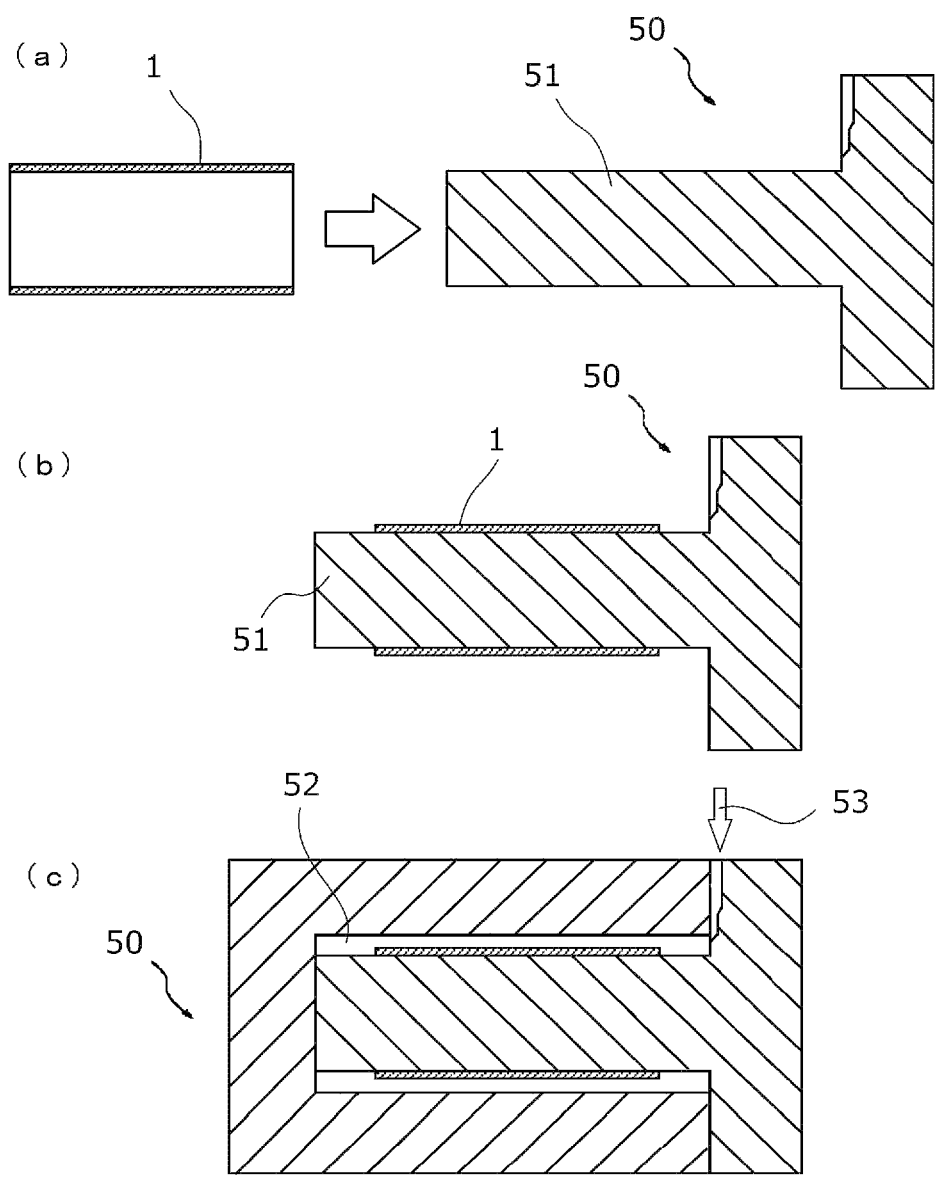
FIG. 5 is a cross-sectional view showing a manufacturing process of the printed-board-integrated molded article formed by insert molding.

As shown in FIG. 5, a method for manufacturing the printed-board-integrated molded article 40 is performed by insert molding. Specifically, first, as shown in (a) of FIG. 5 and (b) of FIG. 5, a molding die 50 having a columnar core 51 corresponding to an inner wall 21a of the molded article 20 is used, and the cylindrical printed board 1 is placed over the core 51 and arranged at a predetermined position. After the molding die 50 is mold-clamped, as shown in (c) of FIG. 5, a molten resin 53 is injected into a cavity 52 to form the molded article 20, and at the same time, the cylindrical printed board 1 is integrated with the inner wall 21a of the molded article 20 (see FIG. 4). Moreover, in FIG. 5, the cylindrical printed board 1 is simplified for easy viewing.

As described above, because the processing shape of the cylindrical printed board 1 is maintained, the cylindrical printed board 1 is smoothly attached to the core 51 of the molding die 50 when insert molding is performed, and as a result, it is easy to insert and install the cylindrical printed board 1 in a hole portion 21 of the molded article 20.

In addition, because the processing shape of the cylindrical printed board 1 is maintained, an unnecessary gap is not partially formed between the cylindrical printed board 1 and the inner wall 21a of the molded article 20, and the cylindrical printed board 1 functions accurately.

In addition, as shown in FIG. 4, the printed-board-integrated molded article 40 of the embodiment is integrated in a manner that the cylindrical printed board 1 is completely embedded in the inner wall 21a of the molded article 20.

Therefore, an internal space of the printed-board-integrated molded article 40 can be widely used, and other component parts can be stored in the internal space. In addition, when the other component parts are stored, the other component parts do not get caught in the cylindrical printed board 1.

Second Embodiment

In the first embodiment, regarding the cylindrical printed board 1, a configuration including the conductor pattern 3 that has a single function of only working as a touch sensor has been described as an example.

Figure 6:
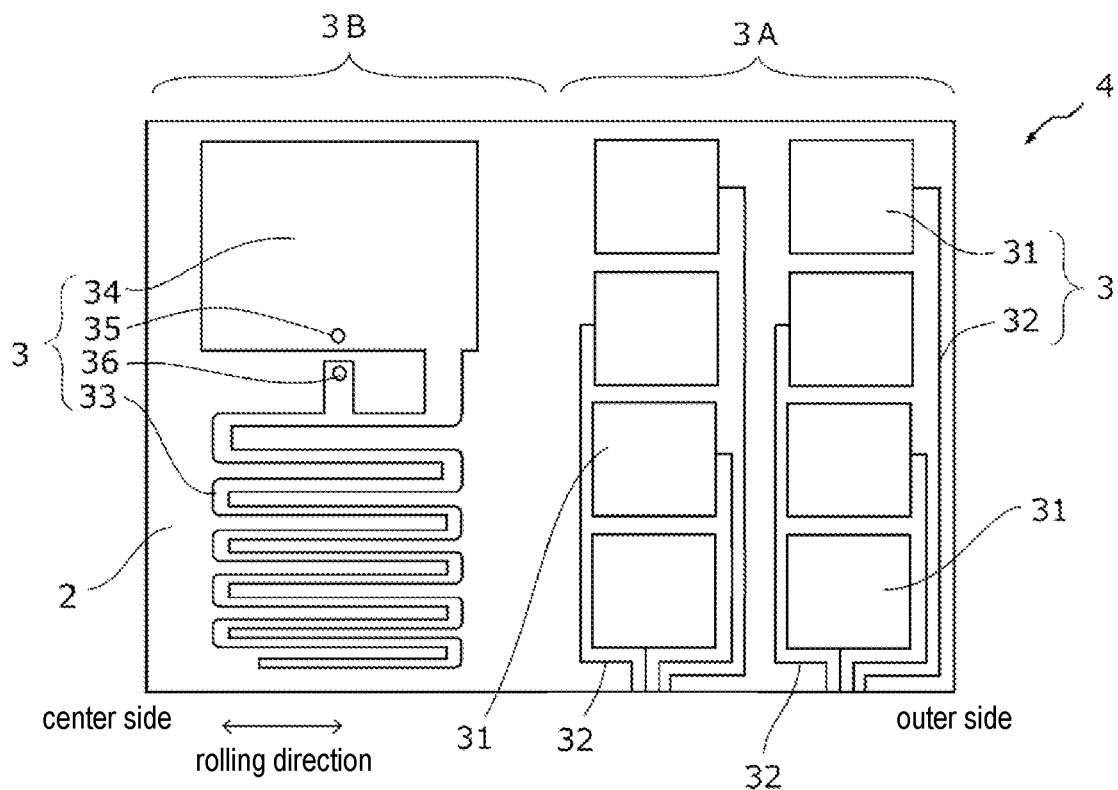
FIG. 6 is a plan view showing a printed board obtained by developing another embodiment of the cylindrical printed board according to the present invention.

However, the embodiments of the present invention are not limited thereto. For example, as shown in FIG. 6, the cylindrical printed board 1 may include a first functional region 3A in which a conductor pattern 3 having a first function is formed and a second functional region 3B which is adjacent to the first functional region 3A in the rolling direction and in which a conductor pattern 3 having a second function is formed. Moreover, the first functional region 3A overlaps with the second functional region 3B.

Here, overlapping means that either the first functional region 3A or the second functional region 3B is rolled at least half a full circle.

Because the conductor patterns 3 having different functions overlap and exist in this way, a space can be effectively used, and a plurality of functions can be obtained without increasing a size of the printed board.

In the cylindrical printed board 1 shown in FIG. 6, within the printed board 4 rolled around two full circles, an outer circle is the first functional region 3A, and an inner circle is the second functional region 3B. As different functions, for example, the first functional region 3A is a touch sensor function, while the second functional region 3B is an antenna function for IoT.

The conductor pattern 3 having the antenna function for IoT has a pattern antenna including a conductive thin film formed on the surface 2a of the insulator substrate 2 on the outer peripheral side.

As the pattern antenna arranged on the cylindrical printed board 1, for example, an inverted F-type pattern antenna is widely used. The inverted F-type pattern antenna includes a ground portion 33 in which a pattern is formed on the insulator substrate 2, and an antenna element portion 34 connected to the ground portion 33. In addition, the inverted F-type pattern antenna includes feeding points 35 and 36. In an example shown in FIG. 6, the antenna element portion 34 is bent a plurality of times to form a meandering (meander) shape, and thereby a length of the antenna element portion 34 is ensured and the pattern antenna is constituted in a region having a small area. Moreover, the pattern antenna may be another pattern.

The pattern antenna uses, for example, a metal such as gold, silver, copper, iron, nickel, chromium, or the like. The pattern antenna preferably uses the same material as the sensor electrode 31.

As a method for forming the pattern antenna, similar to the sensor electrode 31, a method can be used in which a conductive film made of the antenna material described above is formed entirely on the insulator substrate 2 in a state of being developed, and then unnecessary parts are removed by etching.

Moreover, in the cylindrical printed board 1 of a second embodiment, the conductor pattern non-forming region 4B in which the conductor pattern 3 is not formed as in the first embodiment is not arranged. This is because the strength of the cylindrical printed board 1 is sufficiently increased because only the first functional region 3A and the second functional region 3B are rolled two full circles. Because other points are the same as those in the first embodiment, the descriptions thereof are omitted.

Other Embodiments

Hereinafter, other embodiments of the cylindrical printed board 1 according to the present invention are described. Moreover, configurations disclosed in each of the following embodiments can also be applied in combination with configurations disclosed in other embodiments as long as there is no contradiction.

(1) In the first embodiment described above, regarding the cylindrical printed board 1, a configuration has been described as an example, which has the conductor pattern forming region 4A in which the conductor pattern 3 is formed on the insulator substrate 2 and the conductor pattern non-forming region 4B which is adjacent to the center side of the conductor pattern forming region 4A in the rolling direction and in which the conductor pattern 3 is not formed on the insulator substrate 2. However, the embodiments of the present invention are not limited thereto.

Figure 7:
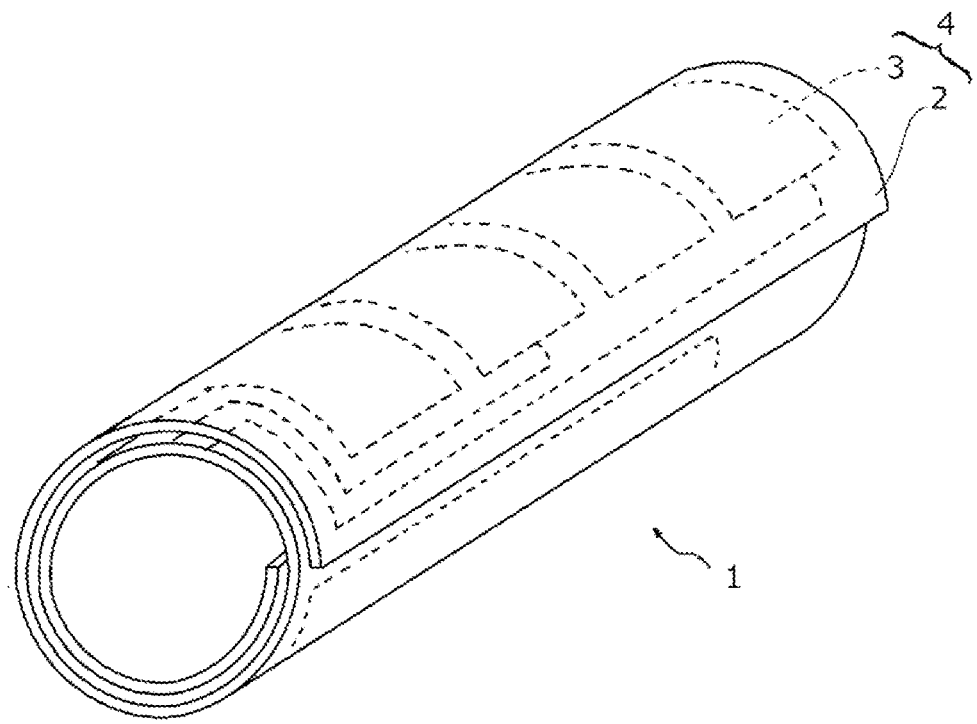
FIG. 7 is a perspective view showing another embodiment of the cylindrical printed board according to the present invention.
Figure 8:
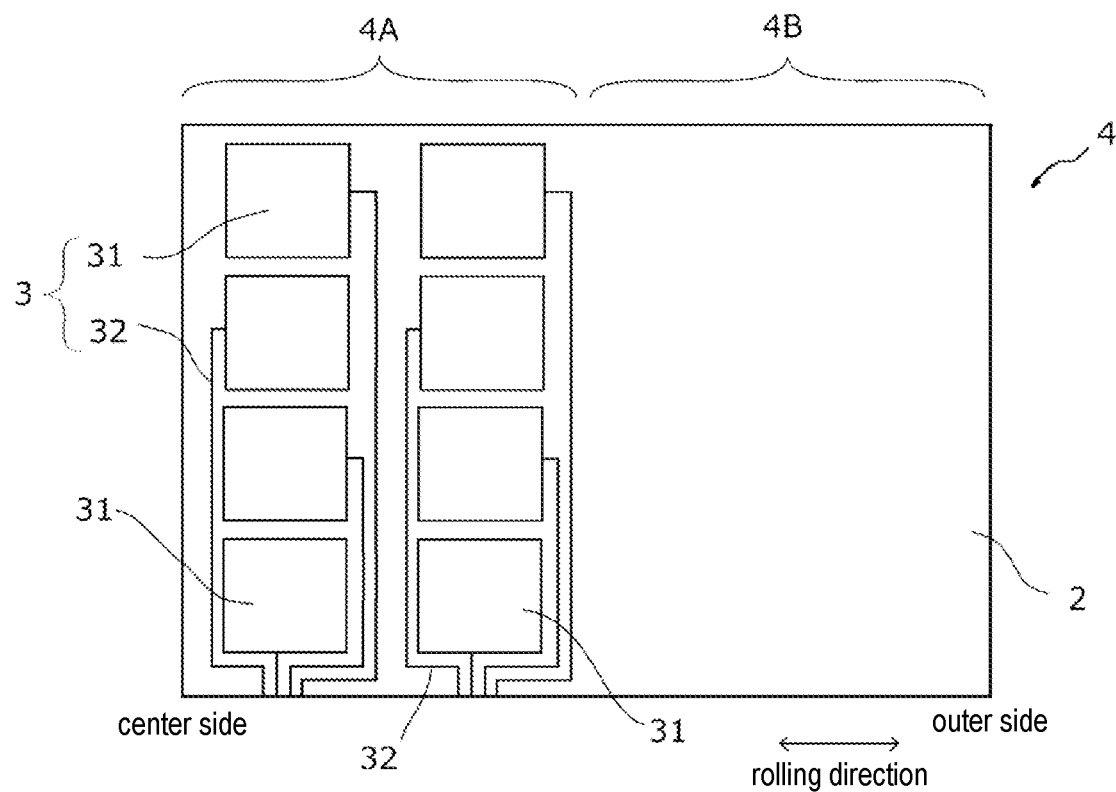
FIG. 8 is a plan view showing a printed board obtained by developing the cylindrical printed board in FIG. 7.

For example, as shown in FIGS. 7 and 8, the conductor pattern non-forming region 4B may be arranged adjacent to an outer side of the conductor pattern forming region 4A in the rolling direction. In addition, the conductor pattern non-forming region 4B may be arranged adjacent to each of the center side and the outer side from the conductor pattern forming region 4A in the rolling direction. According to these configurations, the conductor pattern non-forming region 4B on the outer side also functions as a protective layer.

(2) In each of the above embodiments, a configuration in which the printed board 4 is only rolled beyond one full circle has been described as an example. However, the embodiments of the present invention are not limited thereto.

Figure 9:
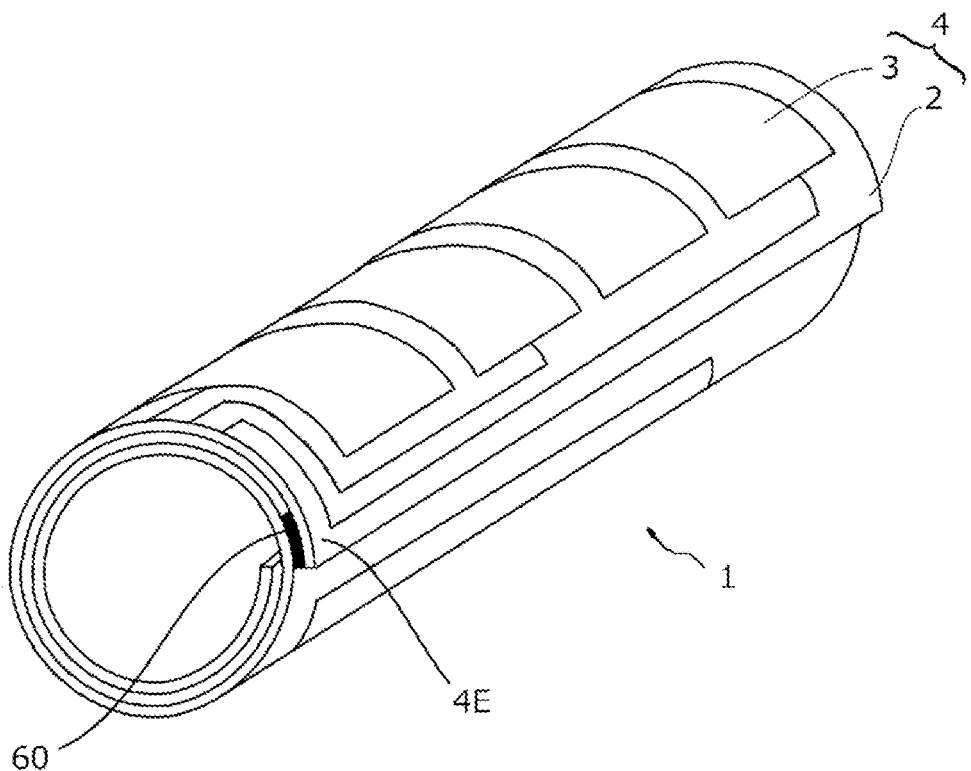
FIG. 9 is a perspective view showing another embodiment of the cylindrical printed board according to the present invention.

For example, as shown in FIG. 9, at least an outer end portion 4E in the overlapping region of the printed board 4 may be fixed.

According to this configuration, even if a force acts to restore the insulator substrate 2 rolled in a cylindrical shape to an original shape by rigidity of the insulator substrate 2, the return of the rolling processing is further reliably suppressed by fixing in the overlapping region of the printed board 4.

As a method of fixing, in addition to a method using an adhesive 60, a known technique such as a laser thermal fusion method, an ultrasonic fusion method, or the like can be used.

(3) In each of the above embodiments, a configuration has been described as an example, in which the cylindrical shape is a columnar shape in which the diameter of the printed board 4 rolled into a cylindrical shape is the same at both ends of the cylinder. However, the embodiments of the present invention are not limited thereto.

Figure 10:
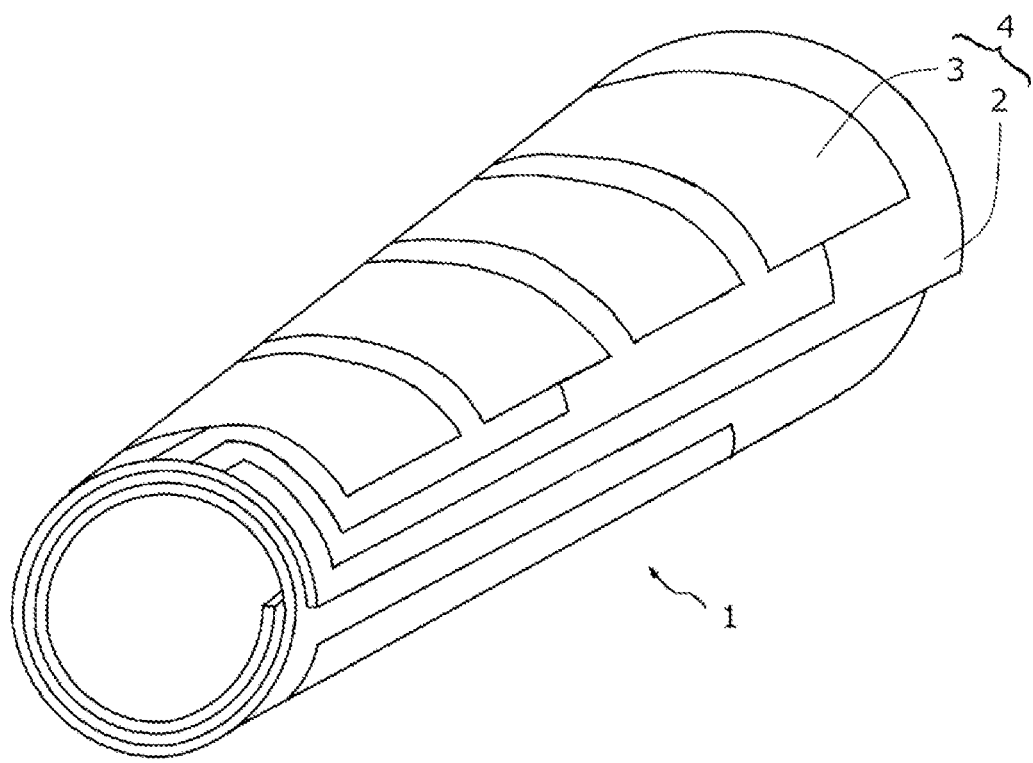
FIG. 10 is a perspective view showing another embodiment of the cylindrical printed board according to the present invention.

For example, as shown in FIG. 10, the cylindrical shape may be a truncated conical shape in which the diameter of the printed board rolled into a cylindrical shape differs at both ends of the cylinder. In this case, the rolling processing is performed using a conical or truncated conical jig.

(4) In each of the above embodiments, a configuration has been described as an example, in which the printed-board-integrated molded article 40 is manufactured by insert molding and is integrated in a manner that the cylindrical printed board 1 is completely embedded in the inner wall 21a of the molded article 20. However, the embodiments of the present invention are not limited thereto.

Figure 11:
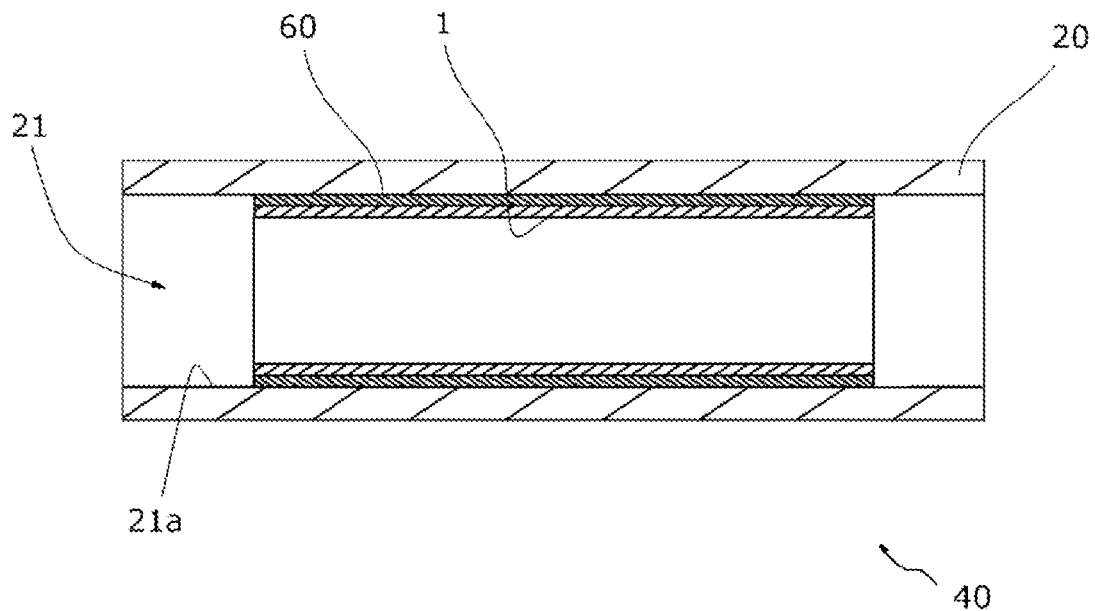
FIG. 11 is a cross-sectional view showing another embodiment of the printed-board-integrated molded article according to the present invention.

For example, as shown in FIG. 11, the cylindrical printed board 1 may be integrated in a manner that an outermost region of rolling is bonded onto the molded article 20. In the drawing, a reference numeral 60 denotes an adhesive.

Moreover, because the processing shape of the cylindrical printed board 1 is maintained, an outer shape of the cylindrical printed board 1 matches a shape of the hole portion 21 of the molded article 20 at the time of bonding, and as a result, it is easy to insert and install the cylindrical printed board 1 in the hole portion 21 of the molded article 20.

(5) In each of the above embodiments, a configuration in which the cylindrical printed board 1 has the touch sensor function only or has the touch sensor function and the antenna function for IoT has been described as an example. However, the embodiments of the present invention are not limited thereto.

For example, at least one or more of various functions such as a touch sensor, a pressure sensor, an antenna for IoT, a heater, a LED circuit, a cable harness, and the like may be combined. In addition, functions other than these functions may be combined.

(6) In the first embodiment described above, a configuration in which the cylindrical printed board 1 is connected to the external control circuit via the FPC arranged separately has been described as an example. However, the embodiments of the present invention are not limited thereto.

Figure 12:
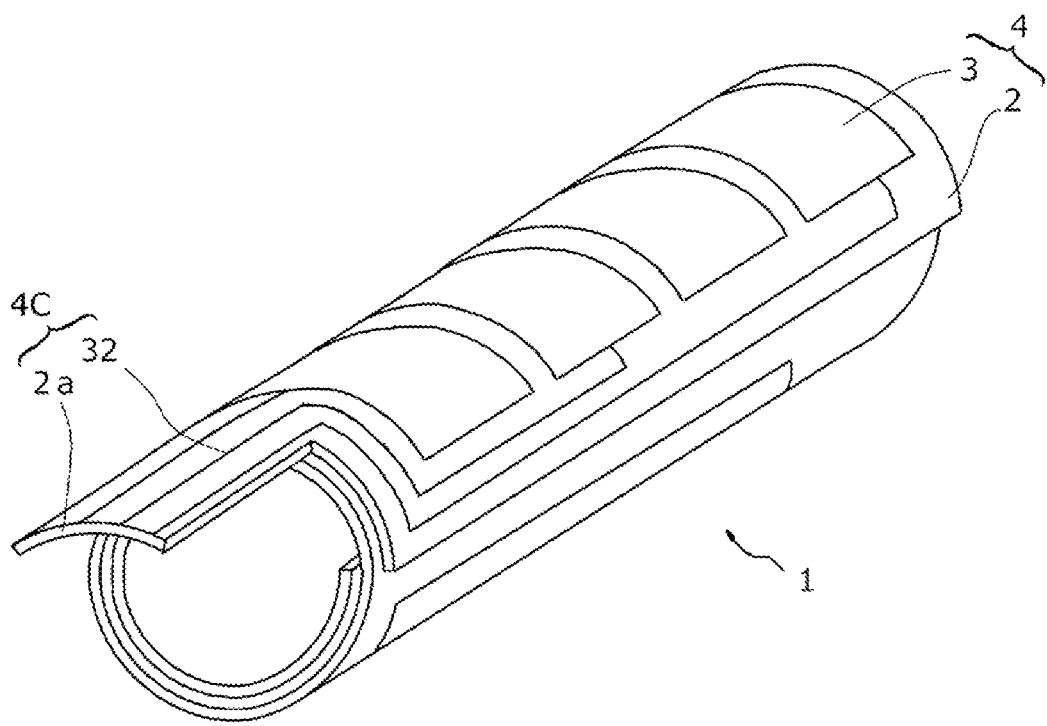
FIG. 12 is a perspective view showing another embodiment of the cylindrical printed board according to the present invention.

For example, as shown in FIG. 12, an extension connection piece 2a that can be partially extended and bent in a direction orthogonal to the rolling direction of the insulator substrate 2 may be set, and a FPC part 4C may be formed on the printed board 4 by extending a connection wiring such as the sensor wiring 32 or the like on the extension connection piece 2a, thereby forming a FPC-integrated cylindrical printed board 1.

According to this configuration, by integrating a main body of the printed board 4 and an insulator substrate of the FPC part 4C, it is not necessary to separately prepare and connect the FPC, and the number of component parts can be reduced.

Figure 13:
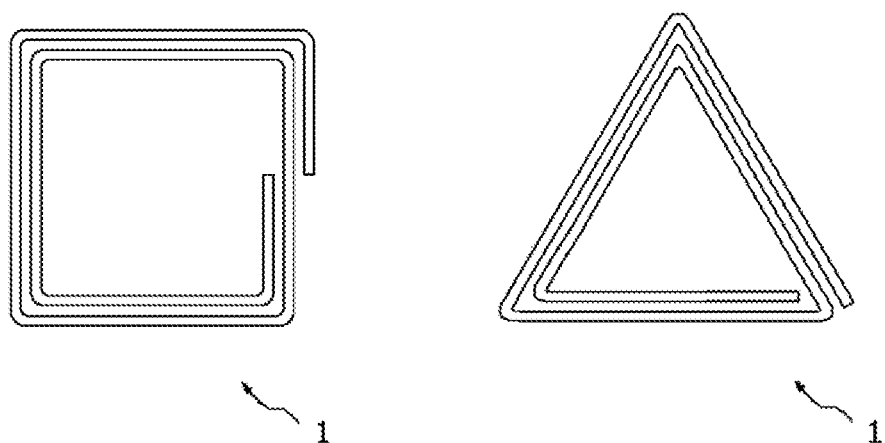
FIG. 13 is a schematic diagram illustrating an outer shape of an end surface of the cylindrical printed board according to the present invention.

(7) In each of the above embodiments, a configuration in which an outer shape of an end surface of the cylindrical printed board 1 is a circle has been described as an example. However, the embodiments of the present invention are not limited thereto. For example, as shown in FIG. 13, the outer shape of the end surface of the cylindrical printed board 1 may be a quadrangle, a triangle, or other polygons. In addition, similar to an ellipse, a rectangle, or the like for example, the outer shape of the end surface of the cylindrical printed board 1 may have different vertical and horizontal dimensions.

(8) In each of the above embodiments, a configuration in which the printed-board-integrated molded article 40 is formed in a manner that the molded article 20 completely covers the end surface and the outer peripheral surface of the cylindrical printed board 1 has been described as an example. However, the embodiments of the present invention are not limited thereto.

Figure 14:
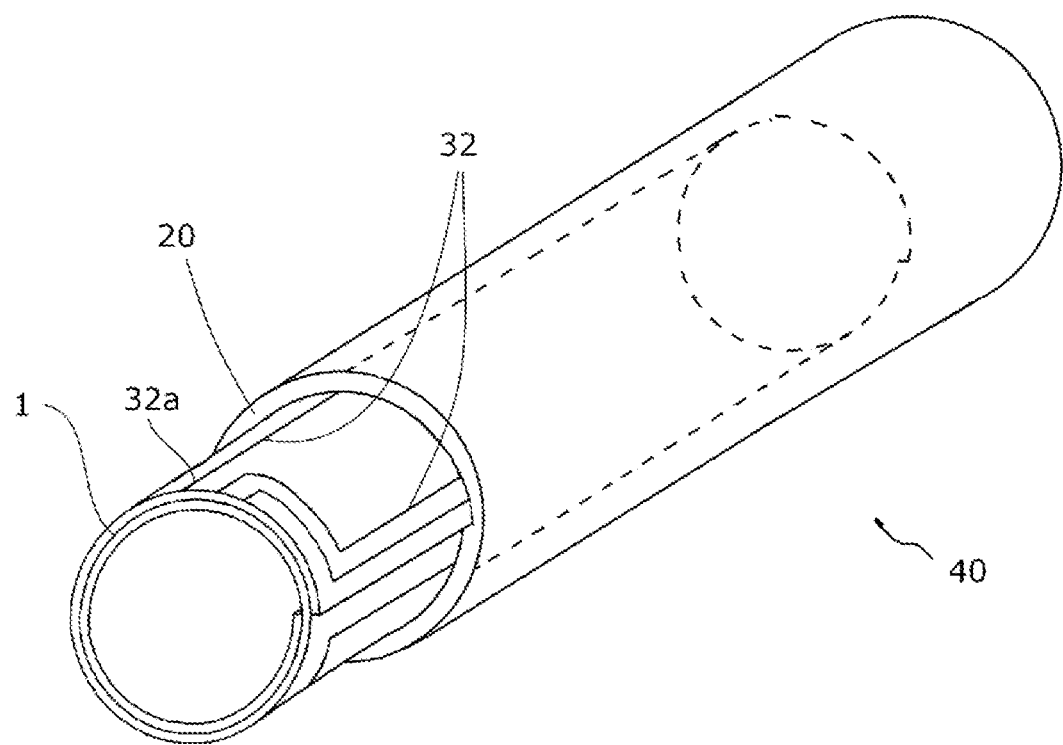
FIG. 14 is a perspective view showing another embodiment of the printed-board-integrated molded article according to the present invention.

For example, the printed-board-integrated molded article 40 may expose the outer peripheral surface from the molded article 20 at an end portion of the cylindrical printed board 1. Only one end of the cylindrical printed board 1 may be exposed (see FIG. 14), or both ends thereof may be exposed.

According to this configuration, because the wiring arranged on the outer peripheral surface of the cylindrical printed board 1, for example, a connection end portion 32a of the sensor wiring 32 can be exposed from the molded article 20, a connection with the FPC which is a separate member (not shown) is easy.

Moreover, in a case of the FPC-integrated cylindrical printed board 1 described in the above (6), the FPC part 4C may be exposed from the molded article 20.

Furthermore, the printed-board-integrated molded article 40 may expose only the end surface of the cylindrical printed board 1 to the inner side of an end surface of the molded article 20 at one end or both ends of the cylindrical printed board 1.

According to this configuration, a formation position and the like of the wiring of the cylindrical printed board 1 can be confirmed from the outside. Therefore, it is easy to find a defect in positional deviation and the like between the molded article 20 and the cylindrical printed board 1 in a circumferential direction.

As for the case where the outer peripheral surface is exposed from the molded article 20 at the end portion of the cylindrical printed board 1 described above, FIG. 15 shows an example of a manufacturing process of the printed-board-integrated molded article 40.

Figure 15:
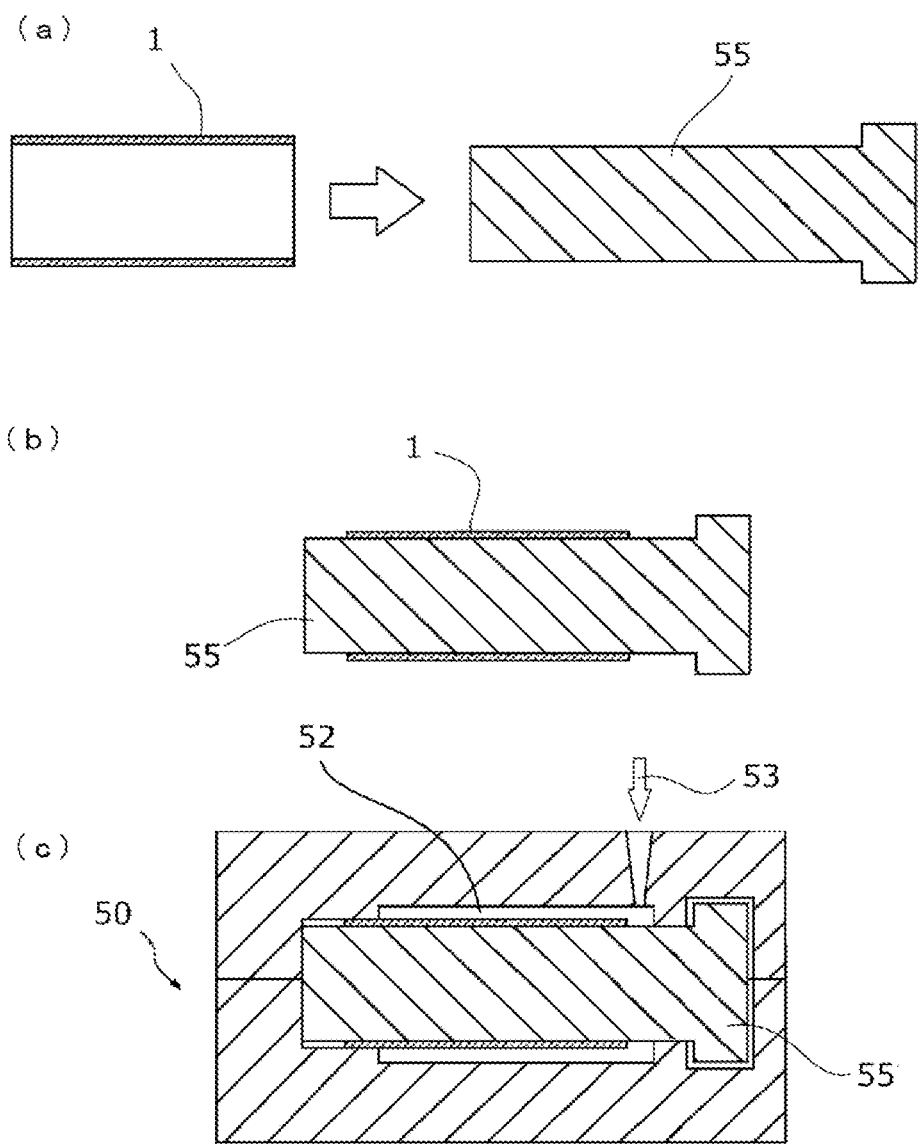
FIG. 15 is a cross-sectional view showing another manufacturing process of the printed-board-integrated molded article formed by insert molding.
Figure 16:
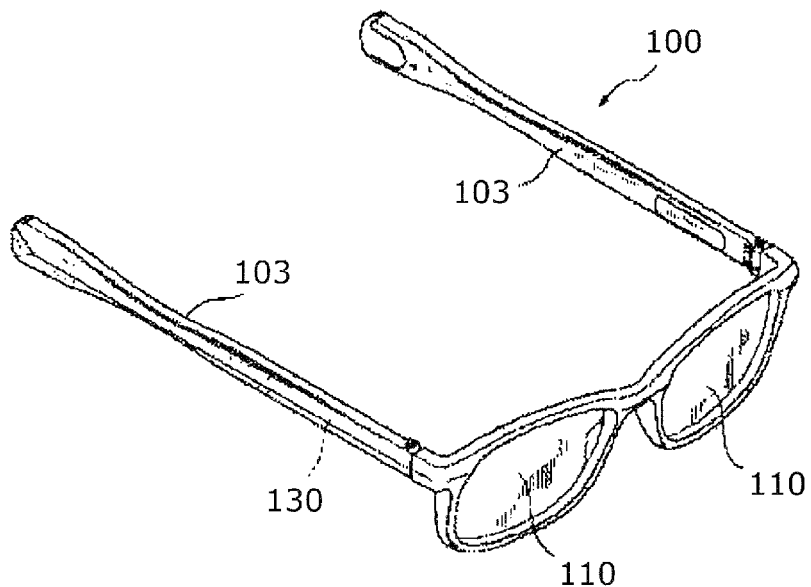
FIG. 16 is a perspective view showing a bifocal eyeglass equipped with a lens focus switching function.

Specifically, first, as shown in (a) of FIG. 15 and (b) of FIG. 15, the cylindrical printed board 1 is placed over a rod-shaped insert pin 55 and arranged at a predetermined position. Next, the molding die 50 divided into upper and lower parts and corresponding to the inner wall 21a of the molded article 20 is used, the insert pin 55 fitted with the cylindrical printed board 1 is arranged between the upper and lower parts of the molding die 50, and the molding die 50 is mold-clamped as shown in (c) of FIG. 15. At this time, one end of the cylindrical printed board 1 and both ends of the insert pin 55 exist to the outer side inside the cavity 52. Thereafter, the molten resin 53 is injected into the cavity 52 to form the molded article 20, and at the same time, the cylindrical printed board 1 is integrated with the inner wall 21a of the molded article 20 (see FIG. 14).

(9) In each of the above embodiments, as an example in which the printed board 4 is rolled beyond one full circle, a configuration in which the printed board 4 is rolled two full circles has been shown; however, of course, if the number of rolling exceeds one circle and there is an overlapping portion, the number of rolling is not limited to two circles.

(10) In each of the above embodiments, a configuration in which the printed board 4 is rolled with the surface on which the conductor pattern 3 is formed as the outer side has been described as an example. However, the embodiments of the present invention are not limited thereto.

For example, the printed board 4 may be rolled with the surface on which the conductor pattern 3 is formed as the center side.

In addition, in the printed board 4, the conductor patterns 3 may be respectively formed on both surfaces of the insulator substrate 2. In addition, the printed board 4 may be obtained by laminating two insulator substrates 2 in which the conductor pattern 3 is formed on one surface of each insulator substrate. The lamination may be performed by aligning the insulator substrates with each other, or may be performed by aligning the insulator substrate of one printed board with the conductor pattern 3 of the other printed board.

In these cases, the conductor pattern 3 on either surface is preferably coated with an insulating layer. As the insulating layer, for example, an insulating film such as polyethylene terephthalate, polycarbonate, polyimide, or the like can be laminated. In addition, the insulating layer may be an ink coating film.

Third Embodiment

In the first embodiment, a configuration in which a rectangular printed board 4 is rolled beyond one full circle to form a cylindrical shape has been described as an example. However, the embodiments of the present invention are not limited thereto.

For example, as shown in (a) of FIG. 21, regarding the cylindrical printed board 1, the printed board 4 is spirally rolled to form a cylindrical shape, the printed board 4 does not have an overlapping region, and an abutting portion 7 of the printed board 4 is fixed. The cylindrical printed board 1 in (a) of FIG. 21 has a parallel quadrilateral shape in a state of being developed (see (b) of FIG. 21). The printed board 4 is spirally rolled so that the conductor pattern 3 comes to the outer side of rolling along a rolling direction shown in (b) of FIG. 21, and thereby the cylindrical printed board 1 as shown in (a) of FIG. 21 is obtained.

The cylindrical printed board 1 in (a) of FIG. 21 is rolled two or more full circles to form a cylindrical shape. In addition, the cylindrical printed board 1 does not have an overlapping region, and is abutted by the abutting portion 7. Then, the cylindrical printed board 1 is fixed at the abutting portion 7.

In this way, because the printed board 4 is fixed at the abutting portion 7, the return of the rolling processing is suppressed. In addition, because the printed board 4 is spirally rolled, the cylindrical shape is less likely to be distorted as compared with a case where the printed board 4 is simply rolled one circle to fix the abutting portion. Thus, the cylindrical shape can be maintained. Because the shape can be maintained, an electrical characteristic is stable.

In addition, the cylindrical printed board 1 is spirally rolled. Therefore, the rigidity is higher than that of the conventional printed board which is simply rolled one full circle to form a cylindrical shape. Thus, when the cylindrical printed board 1 is, for example, insert-molded, because the insulator substrate is less likely to be stretched due to the flow or pressure of the resin, a wrinkle is less likely to occur.

Furthermore, because the printed board is spirally rolled, it is easier to make the cylindrical shape into a truncated conical shape than in the first and second embodiments. This means that, for example, when the core 51 (see FIG. 5) and the insert pin 55 (see FIG. 15) have a draft angle, it is easy to shape the cylindrical printed board 1 along the draft angle.

Because the other points are the same as those in the first embodiment, the descriptions thereof are omitted.

Fourth Embodiment

In the first to third embodiments, a configuration in which the printed board 4 is rolled beyond one full circle or spirally rolled to form a cylindrical shape has been described as an example. However, the embodiments of the present invention are not limited thereto.

For example, as shown in (a) of FIG. 22, the printed board 4 may be rolled beyond one full circle to form a cylindrical shape, and the conductor pattern 3 may have a connection wiring 35 that extends in parallel to an axial direction of the cylindrical printed board and reaches at least one end portion of the printed board 4, and may have at least one notch 10 directed along the connection wiring 35 from one end portion to the other end portion. In (a) of FIG. 22, the printed board 4 is rolled two full circles.

When the cylindrical printed board 1 shown in (a) of FIG. 22 is developed, for example, the cylindrical printed board 1 has a rectangular shape as shown in (b) of FIG. 22. A conductor pattern forming region 4A is formed on the outer side of rolling, and a conductor pattern non-forming region 4B is formed on the center side of rolling. Thus, in (a) of FIG. 22, an outer circle is the conductor pattern forming region 4A, and an inner circle is the conductor pattern non-forming region 4B. The conductor pattern 3 has a sensor electrode 31 and a sensor wiring 32 extending from the sensor electrode 31 in a direction parallel to the rolling direction and further extending in a direction perpendicular to the rolling direction. The sensor wiring 32 reaches the end portion of the printed board 4. At the end portion, the sensor wiring 32 is the connection wiring 35 for external connection.

Moreover, as shown in (a) of FIG. 23 and (b) of FIG. 23, an inner circle may be the conductor pattern forming region 4A, and an outer circle may be the conductor pattern non-forming region 4B.

In addition, as shown in FIG. 24, for example, the printed board 4 may be spirally rolled to form a cylindrical shape, and the conductor pattern may have the connection wiring 35 that extends in parallel to the axial direction of the cylindrical printed board and reaches at least one end portion of the printed board 4, and may have at least two notches along the connection wiring 35 from one end portion to the other end portion. The printed board 4 in FIG. 24 does not have an overlapping region, and the abutting portion 7 of the printed board 4 is fixed.

In the fourth embodiment, because the cylindrical printed board 1 has the notch 10 along the connection wiring 35, a region 35a in which the connection wiring 35 is formed can be bent toward at least one side of the inner side and the outer side of the cylindrical printed board 1 (see (a) of FIG. 25 and (b) of FIG. 25). Thus, the degree of freedom in external connection of the connection wiring 35 is increased.

FIG. 26 is a diagram showing another embodiment of the printed-board-integrated molded article. In a printed-board-integrated molded article 40 in (b) of FIG. 26, for example, the cylindrical printed board 1 as shown in (b) of FIG. 25 is integrally molded. (a) of FIG. 26 is a side view of the printed-board-integrated molded article 40, and (b) of FIG. 26 is a cross-sectional view showing a cross section A-A in (a) of FIG. 26. In the printed-board-integrated molded article 40, the cylindrical printed board 1 is integrated in a manner that an outermost region of rolling is bonded onto the molded article 20, and the region 35a in which the connection wiring 35 is formed is not bonded onto the molded article 20 (see (b) of FIG. 26).

Two notches 10 are formed along the connection wiring 35, and a region sandwiched between the two notches 10 is the region 35a in which the connection wiring is formed (see (b) of FIG. 25 and (a) of FIG. 26). In addition, the adhesive 60 is not formed in a location corresponding to the region 35a in which the connection wiring is formed. In other words, the region 35a in which the connection wiring is formed is a non-adhesive region 1a with the molded article 20 (see (b) of FIG. 26). Moreover, a length of the non-adhesive region 1a from an end surface of the cylindrical printed board 1 to an end surface of the adhesive 60 can be set to, for example, 0.5 mm or more.

In this way, because the cylindrical printed board 1 has the notch and has the non-adhesive region 1a with the molded article, as shown in FIG. 27, the region 35a in which the connection wiring 35 is formed can be easily bent toward the inner side of the cylindrical printed board 1. Thus, the degree of freedom in external connection of the connection wiring 35 is increased.

Moreover, in the printed-board-integrated molded article 40, the cylindrical printed board 1 may be integrated in a manner that at least the outermost region of rolling is embedded in a surface of the molded article 20, and the region 35a in which the connection wiring 35 is formed may not be adhered to the molded article 20 (see FIG. 28). In this form, on a surface of the region 35a in which the connection wiring is formed (a surface on which the connection wiring is formed), processing is performed to avoid the adhesion between a resin constituting the cylindrical printed board 1 and a resin constituting the molded article 20. In this way, the cylindrical printed board 1 can have the non-adhesive region 1a with the molded article 20, and as shown in FIG. 28, the region 35a in which the connection wiring is formed can be easily bent toward the inner side of the cylindrical printed board 1. Thus, the degree of freedom in external connection of the connection wiring 35 is increased.

Other Embodiments

(11) In the third embodiment, the cylindrical printed board 1 having no overlapping region has been described as an example. However, the embodiments of the present invention are not limited thereto.

For example, as shown in FIG. 29, the cylindrical printed board 1 may have an overlapping region 8, and an outermost end portion of rolling 9 may be fixed. The outermost end portion of rolling 9 is, in other words, a part in which the rolling is ended when the rolling is started from the innermost side. In FIG. 29, the rolling start (innermost portion) is on a left side, and the rolling end (outermost portion) is on a right side.

According to this configuration, the printed board 4 generates a frictional force in the overlapping region 8, and the outermost end portion of rolling 9 is fixed, so that the return of the rolling processing is suppressed. In addition, the cylindrical shape is less likely to be distorted as compared with the case where the printed board 4 is simply rolled one full circle to fix the abutting portion. Thus, the cylindrical shape can be maintained. Moreover, because the shape can be maintained, the electrical characteristic is stable.

(12) In the first to fourth embodiments, an example has been described in which the cylindrical printed board 1 and the printed-board-integrated molded article 40 are rectangular in front view. However, the embodiments of the present invention are not limited thereto.

For example, as shown in (a) of FIG. 30, a central part of the cylindrical printed board 1 and the printed-board-integrated molded article 40 may have a bulging shape. In addition, as shown in (b) of FIG. 30, the central part may have a dented shape. In addition, as shown in (c) of FIG. 30, the central part may have a curved shape.

(13) In the fourth embodiment, a configuration in which the molded article 20 completely covers the end surface and the outer peripheral surface of the cylindrical printed board 1 in the printed-board-integrated molded article 40 has been described as an example. However, the embodiments of the present invention are not limited thereto.

For example, as shown in (a) of FIG. 31 and (b) of FIG. 31, there may be a printed-board-integrated molded article 40 in which the outer peripheral surface of the cylindrical printed board 1 is exposed from the molded article 20 on at least one end of the cylindrical printed board 1, the exposed outer peripheral surface has the region 35a in which the connection wiring 35 is formed and at least one notch 10 formed beyond an end portion 20a of the molded article along the region, and a region of the unexposed outer peripheral surface in which the notch 10 is formed is not adhered to the molded article 20. Only one end of the cylindrical printed board 1 may be exposed, or both ends thereof may be exposed.

According to this configuration, the notch 10 is formed beyond the end portion 20a of the molded article, and the region of the unexposed outer peripheral surface in which the notch 10 is formed is not adhered to the molded article 20. That is, a region from the end portion 20a of the molded article to an end portion of the adhesive is the non-adhesive region 1a with the molded article. Because the printed-board-integrated molded article 40 has the non-adhesive region 1a, the printed board in the region 35a in which the connection wiring is formed can be further bent by a length of a non-adhesive part (see FIG. 32). Thus, the degree of freedom in external connection of the connection wiring is further increased.

(14) The printed-board-integrated molded article 40 may include, for example, an electronic component 70, as shown in FIG. 33. The printed-board-integrated molded article 40 shown in FIG. 33 is, for example, a front view of the printed-board-integrated molded article 40 shown in (a) of FIG. 31. The connection wiring is formed between the two notches 10 on the outer peripheral surface of the cylindrical printed board 1. The electronic component 70 is electrically connected to the region 35a in which the connection wiring is formed. This printed-board-integrated molded article can be manufactured by, for example, a method shown in FIG. 34. FIG. 34 shows a stage of mold clamping completion shown in (c) of FIG. 15. FIG. 34 differs from FIG. 15 in that the molding die 50 has an electronic component storage space 56. Because the molding die 50 has the electronic component storage space 56, the molded article 20 can be injection-molded while the electronic component 70 is connected to the cylindrical printed board 1. Moreover, as the electronic component 70, for example, a connector, a chip, or the like can be used. As the chip, for example, a semiconductor chip, an IC chip, a chip component (a very small passive element such as a chip resistor, a chip capacitor, or a chip inductor, or the like), or the like can be used.

(15) In the third embodiment, an example of the cylindrical printed board 1 obtained in a manner that one printed board 4 is spirally rolled to form a cylindrical shape has been described. However, the embodiments of the present invention are not limited thereto.

For example, as shown in FIG. 35, there may be a cylindrical printed board 1 obtained in a manner that two printed boards 4 and 4' are spirally rolled to form a cylindrical shape. Moreover, the two printed boards are fixed at the abutting portion 7.

(16) In the third and fourth embodiments, an example in which the printed board 4 having a parallel quadrilateral shape is spirally rolled to constitute the cylindrical printed board 1 has been described. However, the embodiments of the present invention are not limited thereto.

For example, as shown in FIG. 36, a rectangular printed board 4 may be used. By arranging the printed board 4 at an angle of more than 0 degree and less than 90 degrees with respect to the rolling direction and rolling the printed board 4 in the rolling direction, the cylindrical printed board 1 rolled spirally can be obtained.

(17) In the fourth embodiment, an example of the cylindrical printed board 1 having one or two notches on the innermost or outermost side of rolling has been described. However, the embodiments of the present invention are not limited thereto. For example, as shown in FIG. 37, the cylindrical printed board 1 may have notches on both the innermost and outermost sides of rolling. The innermost side of rolling may be the first functional region 3A, and the outermost side of rolling may be the second functional region 3B. In addition, as shown in (a) of FIG. 38, the cylindrical printed board 1 may have a continuous notch from the inner side of rolling to the outer side of rolling. In the cylindrical printed board 1 in (a) of FIG. 38, the region 35a in which an inner connection wiring is formed can be bent toward the inner side of the cylindrical printed board 1, and the region 35a in which an outer connection wiring is formed can be bent toward the outer side of the cylindrical printed board 1 (see (b) of FIG. 38). Thus, the degree of freedom in external connection of the connection wiring is further increased.

(18) In the first to fourth embodiments, the cylindrical printed board 1 has at least one notch formed in a manner of sandwiching a plurality of connection wirings from both sides (for example, see (a) of FIG. 25 and (b) of FIG. 25). However, the embodiments of the present invention are not limited thereto.

For example, as shown in (a) of FIG. 39, the cylindrical printed board 1 may have a notch 10 between a plurality of connection wirings. According to this configuration, each connection wiring can be freely bent by the notch. Thus, the degree of freedom in external connection of the connection wiring is further increased.

In addition, for example, as shown in (b) of FIG. 39, the cylindrical printed board 1 may have two notches 10 formed in a manner of sandwiching the connection wirings from both sides, and a cut 15 formed between the two notches, and between the connection wirings. Different from the notch 10, the cut 15 does not reach the end portion of the cylindrical printed board 1. In other words, the cut 15 is formed at a predetermined distance from the end portion of the cylindrical printed board 1. According to this configuration, the region 35a in which the connection wiring is formed is likely to be bent by the cut.

(19) It should be understood that, with respect to other configurations as well, the embodiments disclosed herein are exemplary in all respects and the scope of the invention is not limited thereto. Those skilled in the art are able to easily understand that modifications can be made as appropriate without departing from the gist of the present invention. Thus, other embodiments modified without departing from the gist of the present invention are certainly included in the scope of the present invention.

INDUSTRIAL APPLICABILITY

The present invention can be used for a printed board that is compactly stored in a casing of an electronic device such as a wearable device or the like.

What is claimed is:

1. A printed-board-integrated molded article, comprising
a cylindrical printed board, which is a printed board comprising an insulator substrate and a conductor pattern formed on the insulator substrate, wherein the printed board is overlapped and rolled to form a cylindrical shape; and
a molded article constituting a casing that has a cylindrical part,
wherein the cylindrical printed board is integrated in a manner that at least an outermost region of rolling is embedded in an inner wall of a hole portion in the cylindrical part of the molded article.

2. The printed-board-integrated molded article according to claim 1, wherein the cylindrical printed board is spirally rolled to form the cylindrical shape, and an outermost end portion of rolling of the cylindrical printed board is fixed.

3. The printed-board-integrated molded article according to claim 2, wherein the conductor pattern has a connection wiring that extends in parallel to an axial direction of the cylindrical printed board and reaches at least one end portion of the cylindrical printed board, and has at least two notches directed along the connection wiring from the one end portion to the other end portion.

4. The printed-board-integrated molded article according to claim 3, wherein the cylindrical printed board has the connection wiring at least on an innermost side of rolling, and a region having the connection wiring is bent toward an inner side of the cylindrical printed board.

5. The printed-board-integrated molded article according to claim 2, wherein an outer peripheral surface of the cylindrical printed board is exposed from the molded article on at least one end of the cylindrical printed board.

6. The printed-board-integrated molded article according to claim 1, wherein the conductor pattern has a connection wiring that extends in parallel to an axial direction of the cylindrical printed board and reaches at least one end portion of the cylindrical printed board, and has at least one notch directed along the connection wiring from the one end portion to the other end portion.

7. The printed-board-integrated molded article according to claim 6, wherein the cylindrical printed board has the connection wiring at least on an innermost side of rolling, and a region having the connection wiring is bent toward an inner side of the cylindrical printed board.

8. The printed-board-integrated molded article according to claim 7, wherein a region in which the connection wiring is formed is not bonded to the molded article.

9. The printed-board-integrated molded article according to claim 7, wherein an outer peripheral surface of the cylindrical printed board is exposed from the molded article on at least one end of the cylindrical printed board.

10. The printed-board-integrated molded article according to claim 6, wherein a region in which the connection wiring is formed is not bonded to the molded article.

11. The printed-board-integrated molded article according to claim 10, wherein an outer peripheral surface of the cylindrical printed board is exposed from the molded article on at least one end of the cylindrical printed board, the exposed outer peripheral surface has a region in which the connection wiring is formed and at least one notch formed beyond an end portion of the molded article along the region, and a region of the unexposed outer peripheral surface in which the notch is formed is not adhered to the molded article.

12. The printed-board-integrated molded article according to claim 6, wherein an outer peripheral surface of the cylindrical printed board is exposed from the molded article on at least one end of the cylindrical printed board.

13. The printed-board-integrated molded article according to claim 1, wherein an outer peripheral surface of the cylindrical printed board is exposed from the molded article on at least one end of the cylindrical printed board.

14. A printed-board-integrated molded article, comprising
a cylindrical printed board, which is a printed board comprising an insulator substrate and a conductor pattern formed on the insulator substrate, wherein the printed board is spirally rolled to form a cylindrical shape, the printed board does not have an overlapping region, and an abutting portion of the printed board is fixed; and
a molded article constituting a casing that has a cylindrical part,
wherein the cylindrical printed board is integrated in a manner that at least an outermost region of rolling is embedded in an inner wall of a hole portion in the cylindrical part of the molded article.

15. The printed-board-integrated molded article according to claim 14, wherein the conductor pattern has a connection wiring that extends in parallel to an axial direction of the cylindrical printed board and reaches at least one end portion of the cylindrical printed board, and has at least two notches directed along the connection wiring from the one end portion to the other end portion.

16. The printed-board-integrated molded article according to claim 15, wherein the cylindrical printed board has the connection wiring at least on an innermost side of rolling, and a region having the connection wiring is bent toward an inner side of the cylindrical printed board.

17. The printed-board-integrated molded article according to claim 15, wherein a region in which the connection wiring is formed is not bonded to the molded article.

18. The printed-board-integrated molded article according to claim 15, wherein an outer peripheral surface of the cylindrical printed board is exposed from the molded article on at least one end of the cylindrical printed board.

19. The printed-board-integrated molded article according to claim 18, wherein an outer peripheral surface of the cylindrical printed board is exposed from the molded article on at least one end of the cylindrical printed board, the exposed outer peripheral surface has a region in which the connection wiring is formed and at least one notch formed beyond an end portion of the molded article along the region, and a region of the unexposed outer peripheral surface in which the notch is formed is not adhered to the molded article.

20. The printed-board-integrated molded article according to claim 14, wherein an outer peripheral surface of the cylindrical printed board is exposed from the molded article on at least one end of the cylindrical printed board.

* * * * *